US 9,406,548 B2

(12) United States Patent
Cheng et al.

(10) Patent No.: US 9,406,548 B2
(45) Date of Patent: Aug. 2, 2016

(54) FORMATION OF ISOLATION SURROUNDING WELL IMPLANTATION

(71) Applicant: International Business Machines Corporation, Armonk, NY (US)

(72) Inventors: Kangguo Cheng, Schenectady, NY (US); Shom Ponoth, Los Angeles, CA (US); Theodorus Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/922,224

(22) Filed: Oct. 26, 2015

(65) Prior Publication Data

US 2016/0148809 A1 May 26, 2016

Related U.S. Application Data

(62) Division of application No. 14/551,672, filed on Nov. 24, 2014.

(51) Int. Cl.
*H01L 21/027* (2006.01)
*H01L 21/762* (2006.01)
(Continued)

(52) U.S. Cl.
CPC ...... *H01L 21/76224* (2013.01); *H01L 21/0273* (2013.01); *H01L 21/0274* (2013.01); *H01L 21/2253* (2013.01); *H01L 21/266* (2013.01); *H01L 21/26513* (2013.01); *H01L 21/3081* (2013.01); *H01L 21/3086* (2013.01); *H01L 21/30604* (2013.01); *H01L 21/31155* (2013.01)

(58) Field of Classification Search
CPC .................... H01L 21/02109; H01L 21/02296
See application file for complete search history.

(56) References Cited

U.S. PATENT DOCUMENTS

| 5,556,796 A | 9/1996 | Garnett et al. |
| 5,937,286 A | 8/1999 | Abiko |

(Continued)

FOREIGN PATENT DOCUMENTS

JP          06053422 A      2/1994

OTHER PUBLICATIONS

Pending U.S. Appl. No. 14/551,672, filed Nov. 24, 2014, entitled: "Formation of Isolation Surrounding Well Implantation", 48 pages.

(Continued)

*Primary Examiner* — Cheung Lee
(74) *Attorney, Agent, or Firm* — L. Jeffrey Kelly; Steven Meyers

(57) ABSTRACT

Embodiments of present invention provide a method of making well isolations. The method includes forming a hard-mask layer on top of said substrate; forming a first resist-mask on top of a first portion of the hard-mask layer and applying the first resist-mask in forming a first type of wells in a first region of the substrate; forming a second resist-mask on top of a second portion of the hard-mask layer and applying the second resist-mask in forming a second type of wells in a second region of the substrate; applying the first and second resist-masks in transforming the hard-mask layer into a hard-mask, the hard-mask having openings aligned to areas overlapped by the first and second regions of the substrate; etching at least the areas of the substrate in creating deep trenches that separate the first and second types of wells; and filling the deep trenches with insulating materials.

20 Claims, 24 Drawing Sheets

(51) Int. Cl.
*H01L 21/308* (2006.01)
*H01L 21/306* (2006.01)
*H01L 21/3115* (2006.01)
*H01L 21/266* (2006.01)
*H01L 21/225* (2006.01)
*H01L 21/265* (2006.01)

(56) References Cited

U.S. PATENT DOCUMENTS

| | | |
|---|---|---|
| 6,815,738 B2 | 11/2004 | Rim |
| 6,946,710 B2 | 9/2005 | Logan et al. |
| 7,183,152 B1 | 2/2007 | Dakshina-Murthy et al. |
| 7,268,058 B2 | 9/2007 | Chau et al. |
| 7,352,034 B2 | 4/2008 | Booth, Jr. et al. |
| 7,384,830 B2 | 6/2008 | Cohen |
| 7,692,250 B2 | 4/2010 | Booth, Jr. et al. |
| 7,750,429 B2 | 7/2010 | Dyer et al. |
| 7,879,660 B2 | 2/2011 | Booth, Jr. et al. |
| 7,960,791 B2 | 6/2011 | Anderson et al. |
| 7,977,706 B2 | 7/2011 | Lochtefeld |
| 8,017,463 B2 | 9/2011 | Chang |
| 8,173,517 B2 | 5/2012 | Gonzalez et al. |
| 8,513,087 B2 | 8/2013 | Disney et al. |
| 2005/0048727 A1 | 3/2005 | Maszara et al. |
| 2006/0292772 A1 | 12/2006 | Anderson et al. |
| 2008/0283962 A1* | 11/2008 | Dyer .................. H01L 21/3086 257/513 |

OTHER PUBLICATIONS

IBM: List of IBM Patents or Patent Applications Treated As Related (Appendix P), Oct. 29, 2015, 2 pages.
IBM: List of IBM Patents or Patent Applications Treated As Related (Appendix P), Feb. 17, 2016, 2 pages.
Pending U.S. Appl. 15/041,082, filed Feb. 11, 2016, entitled: "Formation of Isolation Surrounding Well Implantation", 44 pages.
Pending U.S. Appl. 14/551,672, filed Nov. 24, 2014, entitled: Formation of Isolation Surrounding Well Implantation, 48 pages.

* cited by examiner

FORMATION OF ISOLATION SURROUNDING WELL IMPLANTATION

BACKGROUND

The present invention relates generally to the field of semiconductor device manufacturing and in particular relates to method of defining and forming well isolation surrounding implanted wells in a semiconductor substrate.

As demand for advanced semiconductor devices such as those being often used in smartphones and high-definition television (HDTV) sets, for example, continues to soar and evolve, so do these semiconductor devices continue to scale down in size and scale up in functionality, and complexity of semiconductor manufacturing technologies continue to become more complicated.

For example, different types of semiconductor transistors may be manufactured on a single wafer or substrate. These types of transistors may include n-type transistors, which are manufactured on p-type wells or regions implanted with positive ions in a substrate, and p-type transistors, which are manufactured on n-type wells or regions implanted with negative ions in the same substrate. In order for the p-type transistors and n-type transistors to function properly as they are designed to, without interfering each other, the p-type wells and n-type wells are generally isolated from each other by well isolations that are made between the p-type wells and n-type wells. With the continued scale down and so shrinkage of real estate for each devices, well isolations are required to be formed in very limited spaces between p-type wells and n-type wells. Moreover, these well isolations are preferably made with as few additional manufacturing steps as possible.

SUMMARY

Embodiments of present invention provide a method of forming well isolation surrounding p-type wells and n-type wells in a semiconductor substrate, and in particular in a substrate having fins formed therein for the formation of fin-type field-effect-transistors (FinFET). The method may include, for example, providing a semiconductor substrate; forming first and second hard-mask layers on top of the substrate; forming a first resist-mask above a first portion of the first hard-mask layer and a corresponding portion of the second hard-mask layer and forming a first type of wells in a first region of the substrate that is not covered by the first resist-mask; forming a second resist-mask above a second portion of the first hard-mask layer and forming a second type of wells in a second region of the substrate that is not covered by the second resist-mask; transforming the first hard-mask layer into a first hard-mask having openings aligned to areas overlapped by the first and second regions of the substrate; etching at least the areas of the substrate in creating deep trenches that separate the first and second types of wells; and filling the deep trenches with insulating materials.

In one embodiment, transforming the first hard-mask layer into the first hard-mask includes applying the first resist-mask in transforming the second hard-mask layer into a second hard-mask; and applying the second hard-mask and the second resist-mask in transforming the first hard-mask layer into the first hard-mask, wherein the second resist-mask is formed directly on top of the first hard-mask layer.

According to one embodiment, the method may further include expanding the openings of the first hard-mask horizontally in an isotropic etching process selective to the second hard-mask and selective to the second resist-mask.

According to another embodiment, the method may further include etching areas of the substrate exposed by the expanded openings of the first hard-mask in creating the deep trenches.

In one embodiment, the first-type of wells are wells implanted with negative ions and the second-type of wells are wells implanted with positive ions.

In another embodiment, applying the second hard-mask and the second resist-mask in forming the first hard-mask includes selectively etching the first hard-mask layer in areas that are neither covered by the second hard-mask nor covered by the second resist-mask until the substrate underneath the first hard-mask layer is exposed.

In yet another embodiment, the first hard-mask layer is materially different from the second hard-mask layer and has different etch selectivity.

In one embodiment, forming the second resist-mask on top of the second portion of the first hard-mask layer includes forming the second resist-mask in a region not previously covered by the first resist-mask, the second portion of the first hard-mask layer being separated by a third portion of the first hard-mask layer, from the first portion of the first hard-mask layer.

In another embodiment, forming the first type of wells in the first region of the substrate includes performing a first ion-implantation in the first region of the substrate that is not covered by the first resist-mask.

In yet another embodiment, forming the second type of wells in the second region of the substrate includes performing a second ion-implantation in the second region of the substrate that is not covered by the second resist-mask, the second type of wells having overlapping regions with the first type of wells in areas corresponding to the third portion of the first hard-mask layer.

In one embodiment, the first hard-mask layer is a nitride hard-mask layer and the second hard-mask layer is a polysilicon hard-mask layer.

In another embodiment, the first hard-mask layer and the second hard-mask layer are made of same material of nitride.

In yet another embodiment, the second hard-mask layer has a thickness that is equal or thicker than a thickness of the first hard-mask layer.

BRIEF DESCRIPTION OF THE DRAWINGS

The present invention will be understood and appreciated more fully from the following detailed description of preferred embodiments, taken in conjunction with the accompanying drawings of which.

Figure 1:
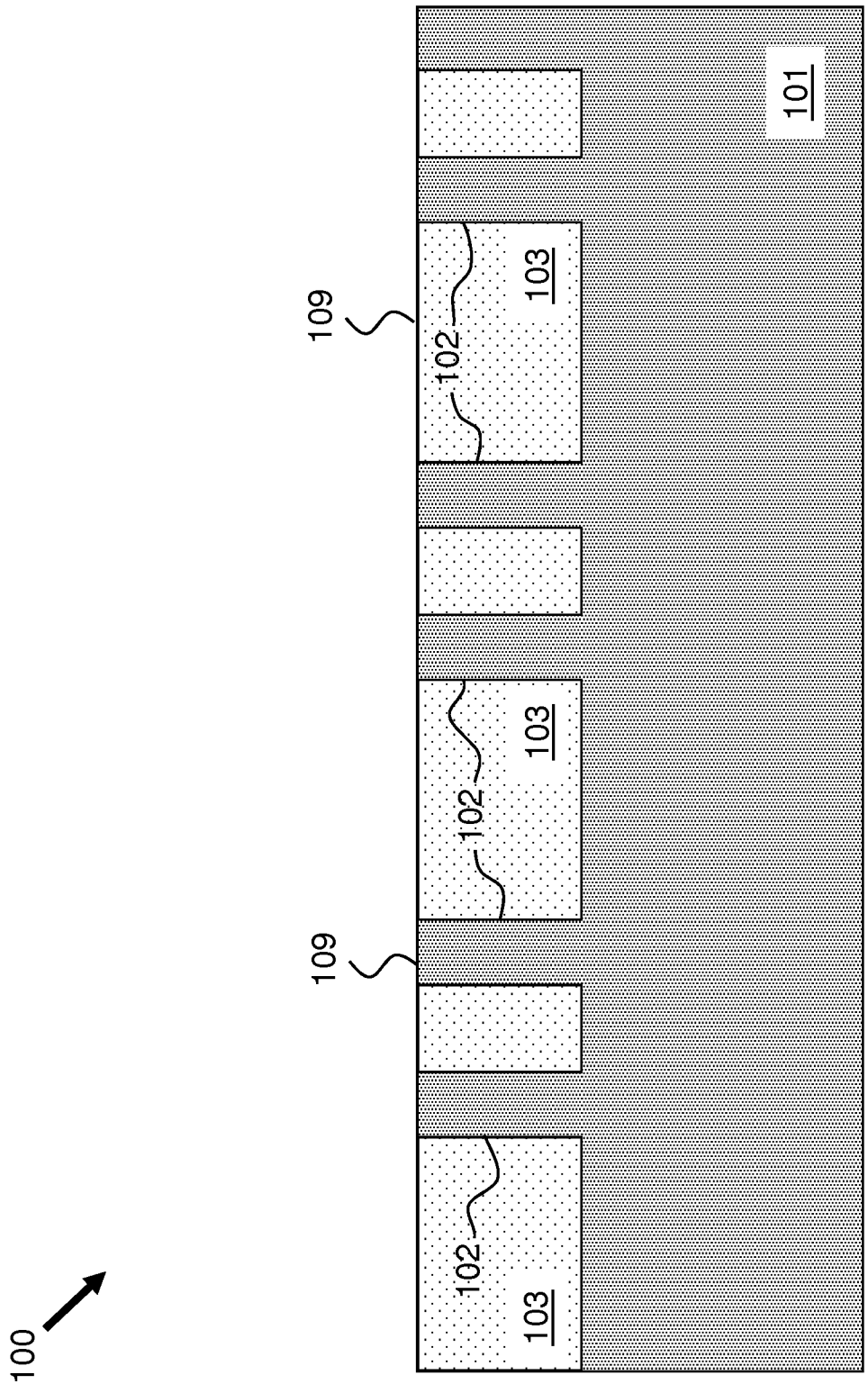
FIG. 1 is a demonstrative illustration of a step of a method of forming wells and isolation surrounding the wells according to one embodiment of present invention.

It will be appreciated that for purpose of simplicity and clarity of illustration, elements in the drawings have not necessarily been drawn to scale. For example, dimensions of some of the elements may be exaggerated relative to those of other elements for clarity purpose.

DETAILED DESCRIPTION

In the following detailed description, numerous specific details are set forth in order to provide a thorough understanding of various embodiments of the invention. However, it is to be understood that embodiments of present invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or published patent applications for reference in order not to obscure description of essence and/or embodiments of the invention. It is to be understood that the following descriptions may have rather focused on distinctive features and/or elements of various embodiments of the invention.

FIG. 1 is a demonstrative illustration of a step of a method of forming wells and isolations surrounding the wells according to one embodiment of present invention. More specifically, as being illustrated in FIG. 1 in forming semiconductor device 100 a semiconductor substrate 101 may be provided and one or more structures such as, for example, structures 102 and 103 may be formed inside substrate 101 and/or in some instances on top of substrate 101. Substrate 101 may be a silicon substrate, a silicon-germanium substrate, a silicon-on-insulator (SOI) substrate, and may contain other suitable semiconductor materials. In some embodiments, structures 102 may be structures made in a fin-like or fin-type shape that are formed to make fin-type field-effect-transistors, or FinFET, as is commonly referred to in the art. Structures 102 may therefore be referred to hereinafter as fins 102. Fins 102 may be formed of material that is same as or different from substrate 101 and may be formed to have a height approximate, for example, 80~120 nm which may vary depending upon specific design aspects. Fins 102 may be surrounded by one or more local shallow isolations, such as structures 103 as being demonstratively illustrated in FIG. 1. The local shallow isolations may be made of oxide, nitride, or other insulating materials. In general, structures 102 and 103 may be formed through suitable currently existing or future developed techniques including etching and/or deposition and may be further processed, via for example a chemical-mechanic-polishing (CMP) process, to have a coplanar top surface 109 for further formation of device 100.

Figure 2:
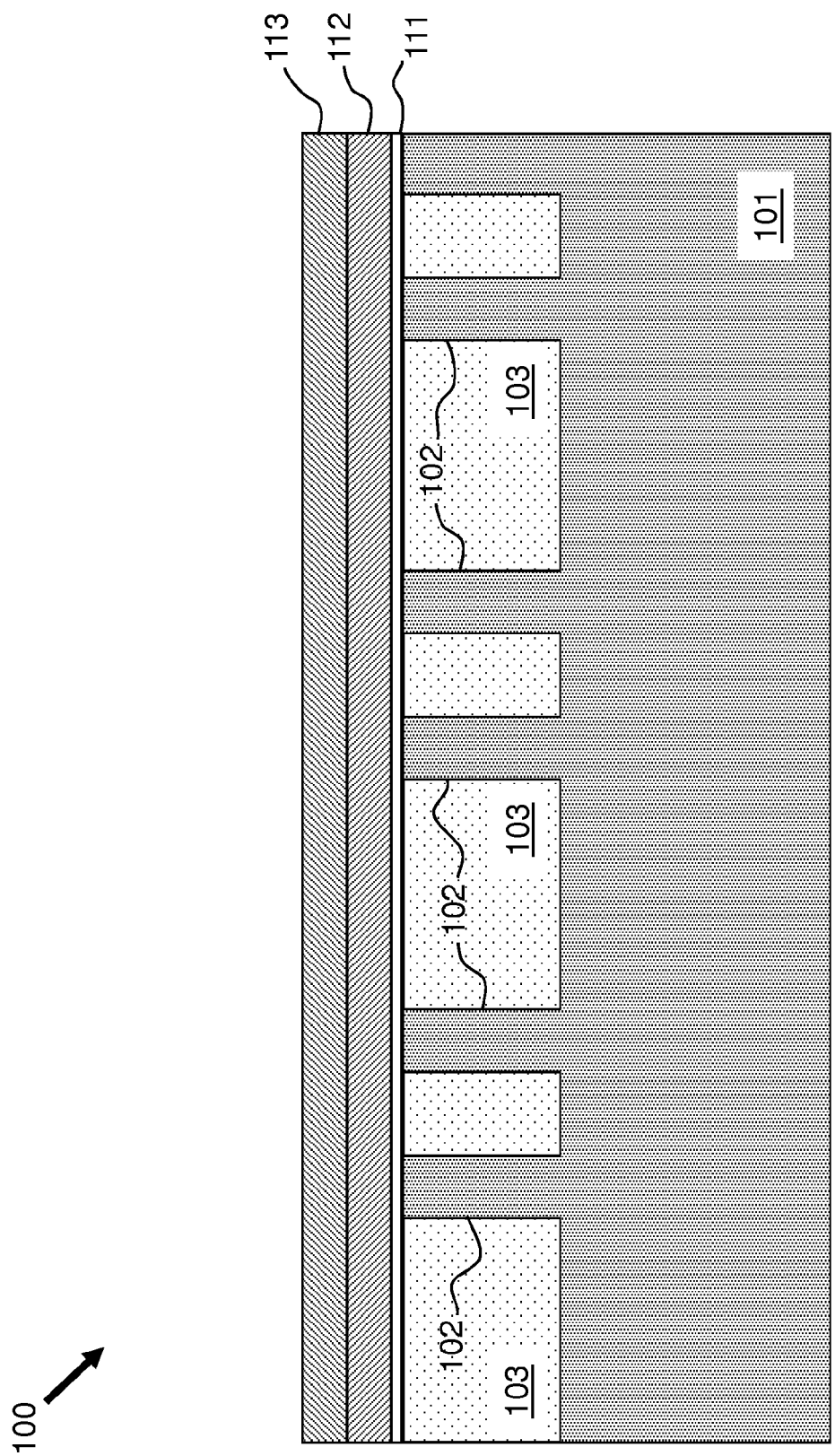
FIG. 2 is a demonstrative illustration of a step of a method of forming wells and isolation surrounding the wells, following the step illustrated in FIG. 1, according to one embodiment of present invention.

FIG. 2 is a demonstrative illustration of a step of a method of forming wells and isolations surrounding the wells, following the step illustrated in FIG. 1, according to one embodiment of present invention. For example, the method may include forming a hard-mask layer or, as in the embodiment illustrated in FIG. 2, a composite hard-mask layer (112 and 113) to cover top surface 109 of structures 102 and 103. Optionally, before forming this composite hard-mask layer, an oxide layer 111 with a thickness around, for example, 2~4 nm may be formed, such as through deposition, directly on top of surface 109. Oxide layer 111 is a thin screen oxide and may be used for protecting the underneath silicon fins or silicon interface from, for example, nitride which sometimes could cause dislocations of silicon inside the substrate.

The composite hard-mask layer may include a nitride hard-mask layer 112 of about 25~35 nm which is applied on top of oxide layer 111 or directly on top of surface 109 if the optional oxide layer 111 is not used. The composite hard-mask layer may also include a poly hard-mask layer 113, such as poly-silicon or other suitable materials as being described below in more details. The poly hard-mask layer 113 may preferably have a thickness around, for example 15~25 nm, and may be applied on top of nitride hard-mask layer 112 through, for example, a chemical-vapor-deposition (CVD) process. Poly hard-mask layer 113 may be used in a process in conjunction with a well-implantation process to transform the underneath nitride hard-mask layer 112 into a hard-mask, which in turn may be used as mask in creating isolations in substrate 101 surrounding the wells created in the well-implantation process. In view of the above purpose, other materials that are suitable as mask materials may be used for hard-mask layer 112 and/or 113.

Figure 3:
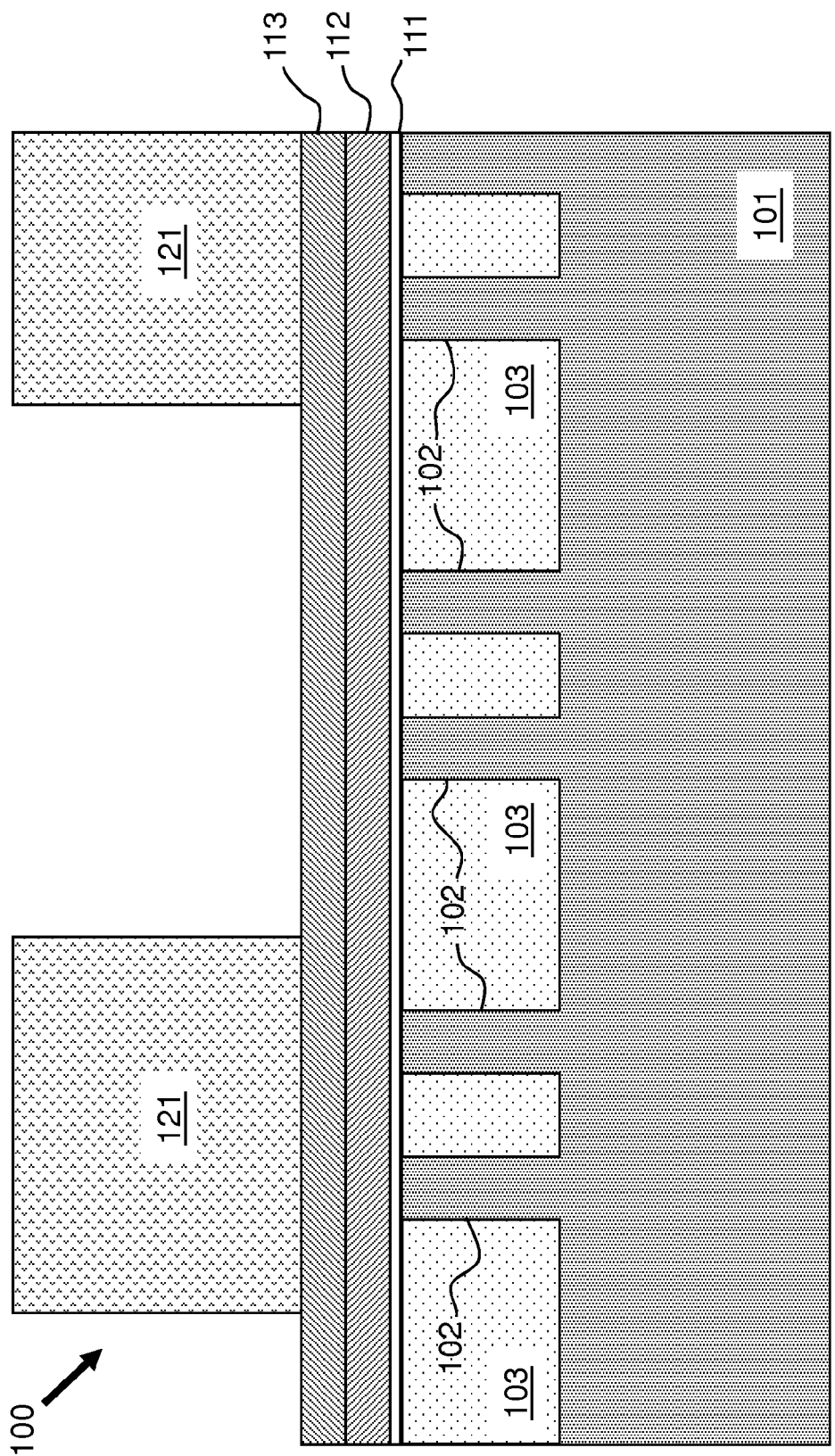
FIG. 3 is a demonstrative illustration of a step of a method of forming wells and isolation surrounding the wells, following the step illustrated in FIG. 2, according to one embodiment of present invention.

FIG. 3 is a demonstrative illustration of a step of a method of forming wells and isolations surrounding the wells, following the step illustrated in FIG. 2, according to one embodiment of present invention. As being described above, in order to form wells either positive or negative types, a photo-resist layer may be applied on top of poly hard-mask layer 113, for example, through a spin-on process and subsequently the photo-resist layer may be exposed and developed into a resist-mask 121, as being illustrated in FIG. 3, through a photolithographic patterning process. In combination with the type of resist-developing agent being used, materials of either positive or negative photo-resist may be used. Resist-mask 121 may cover portions of poly hard-mask layer 113 and corresponding areas of substrate 101 underneath thereof where either negative wells (NW) or positive wells (PW) are to be formed. In the demonstrated example, areas of substrate 101 not covered (thus exposed) by resist-mask 121 are assumed to be formed into negative wells and for this reason resist-mask 121 may sometimes be referred to as NW-mask 121. However, embodiments of present invention are not limited in this aspect and for example, as another embodiment, the areas of substrate 101 not covered by resist-mask 121 may be formed into positive wells, in which case resist-mask 121 may be referred to as PW-mask. Resist-mask 121 may sometimes be referred to as a first resist-mask 121.

Figure 4:
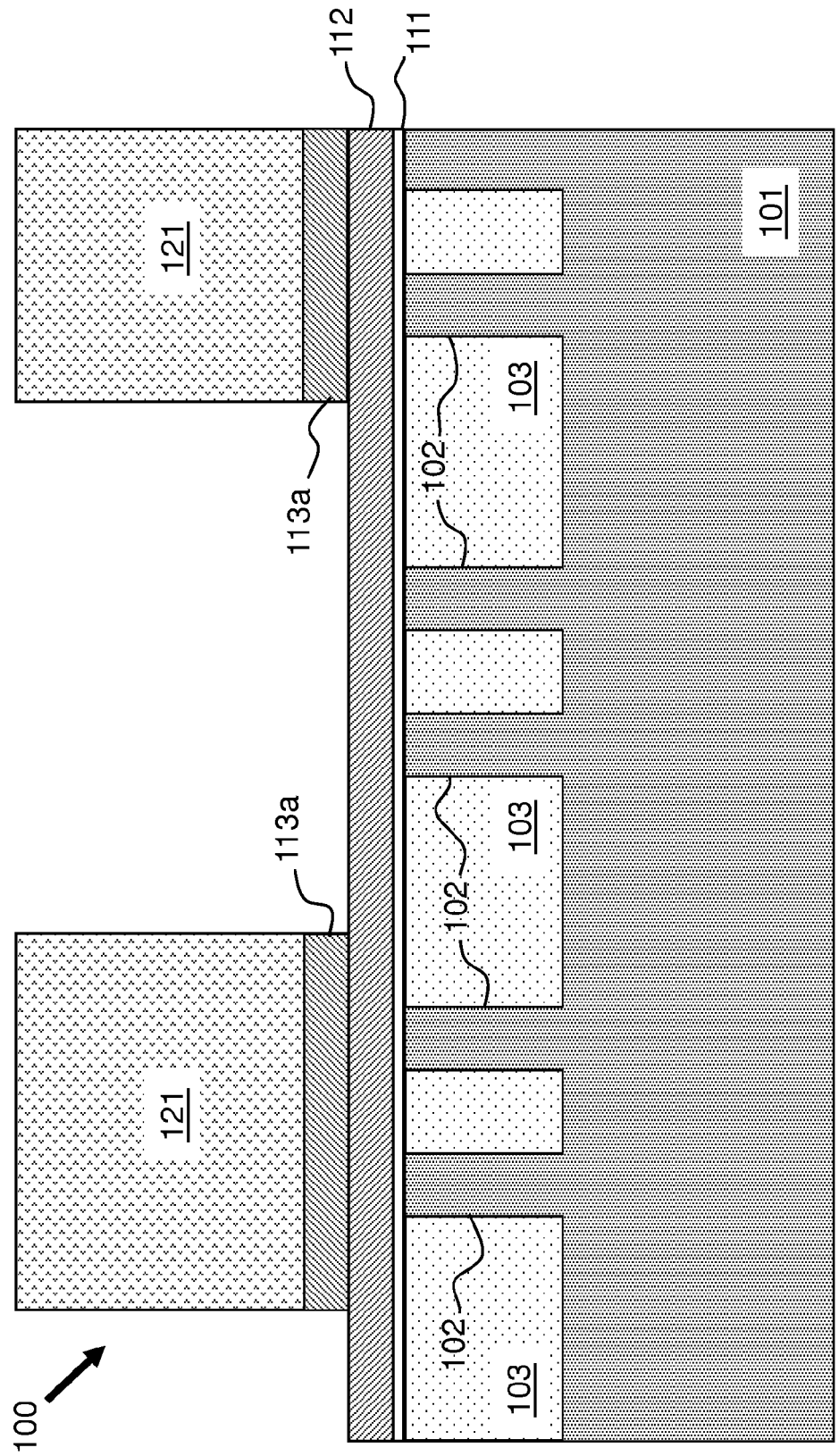
FIG. 4 is a demonstrative illustration of a step of a method of forming wells and isolation surrounding the wells, following the step illustrated in FIG. 3, according to one embodiment of present invention.

FIG. 4 is a demonstrative illustration of a step of a method of forming wells and isolations surrounding the wells, following the step illustrated in FIG. 3, according to one embodiment of present invention. Specifically, the method includes removing portions of poly hard-mask layer 113 that are not covered by resist-mask 121 to transform poly hard-mask layer 113 into a poly hard-mask 113a which inherently resembles the mask shape of resist-mask 121. In other words, while being created for ion-implantation purpose in a well-formation process, embodiment of present invention applies resist-mask 121 as a mask in forming poly hard-mask 113a. Resist-mask 121 is used for both purposes.

More specifically, in forming poly hard-mask 113a, the exposed portion of poly hard-mask layer 113 may be removed or etched away through, for example, a reactive-ion-etching (RIE) process. As being described below in more details with reference to FIG. 7, poly hard-mask 113a may later be used, together with a second resist-mask, in transforming nitride hard-mask layer 112 into a nitride hard-mask 112a that in turn is used in the subsequent formation of isolations surrounding the wells in substrate 101. Here it is to be noted that, according to an alternate embodiment, formation of poly hard-mask 113a may be carried out following the formation of negative wells in substrate 101, which is described below in more details.

Figure 5:
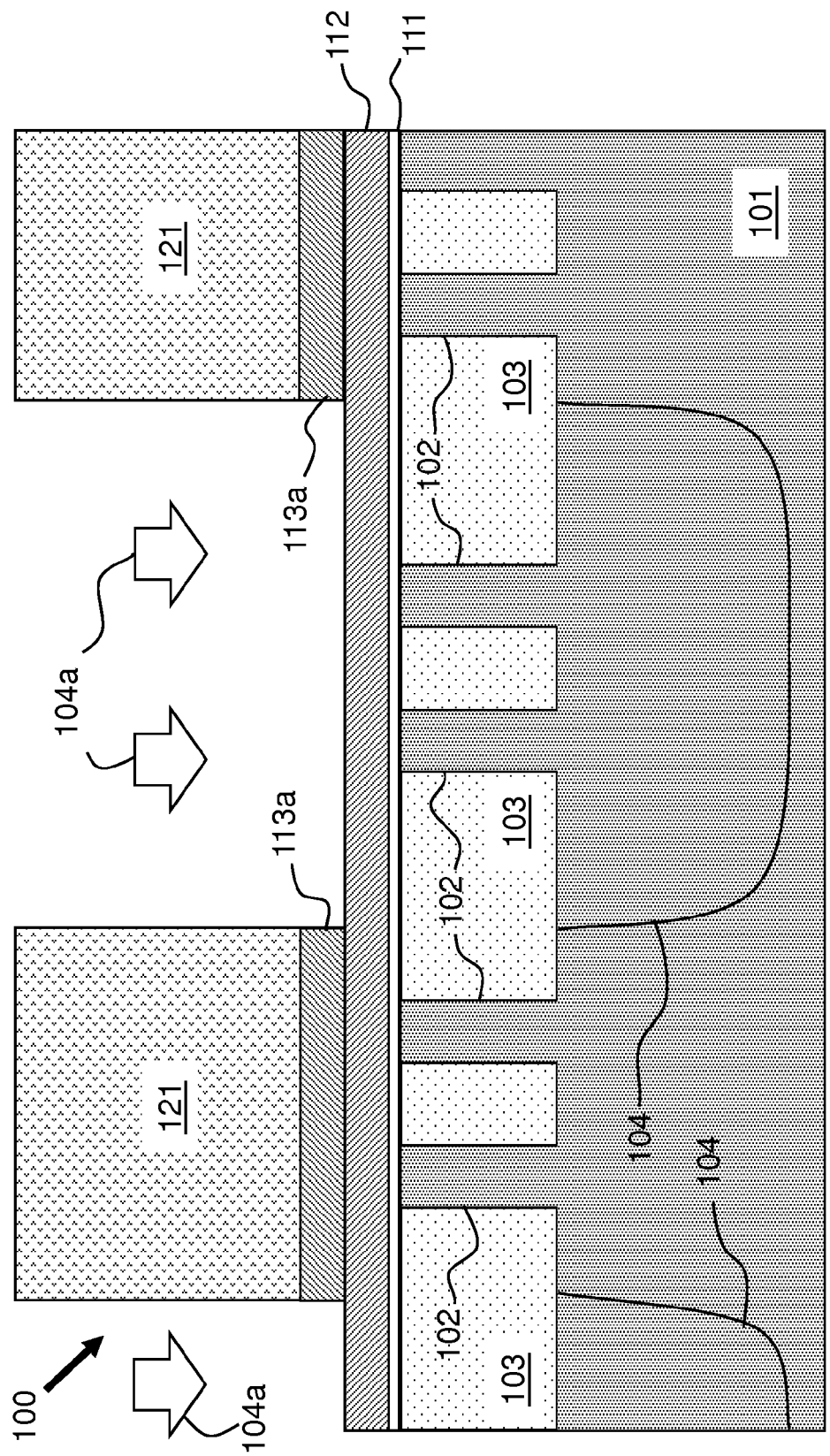
FIG. 5 is a demonstrative illustration of a step of a method of forming wells and isolation surrounding the wells, following the step illustrated in FIG. 4, according to one embodiment of present invention.

FIG. 5 is a demonstrative illustration of a step of a method of forming wells and isolations surrounding the wells, following the step illustrated in FIG. 4, according to one embodiment of present invention. As being noted above, this step may alternately be performed before the formation of poly hard-mask 113a as being described above with reference to FIG. 4.

More specifically, ion-implantation 104a may be performed at this stage to create, for example, negative wells 104 inside substrate 101 in areas not covered or protected by first resist-mask 121. For example, negative ions such as phosphorus ($P^-$) or arsenic ($As^-$) may be implanted into regions of substrate 101 to form negative or n-type wells 104. Depending upon the design of devices, positive ions may be alternately used in the ion-implantation process to create positive or p-type wells as an alternative embodiment. The implantation may cause ions to penetrate through nitride hard-mask layer 112 and the optional oxide layer 111 to reach deep into substrate 101. According to one embodiment, material other than nitride may be used in replacement of nitride hard-mask layer 112 so long as it does not present any substantial obstacle to the ion-implantation process and is suitable to be used later as a mask for formation of well isolation inside substrate 101.

Figure 6:
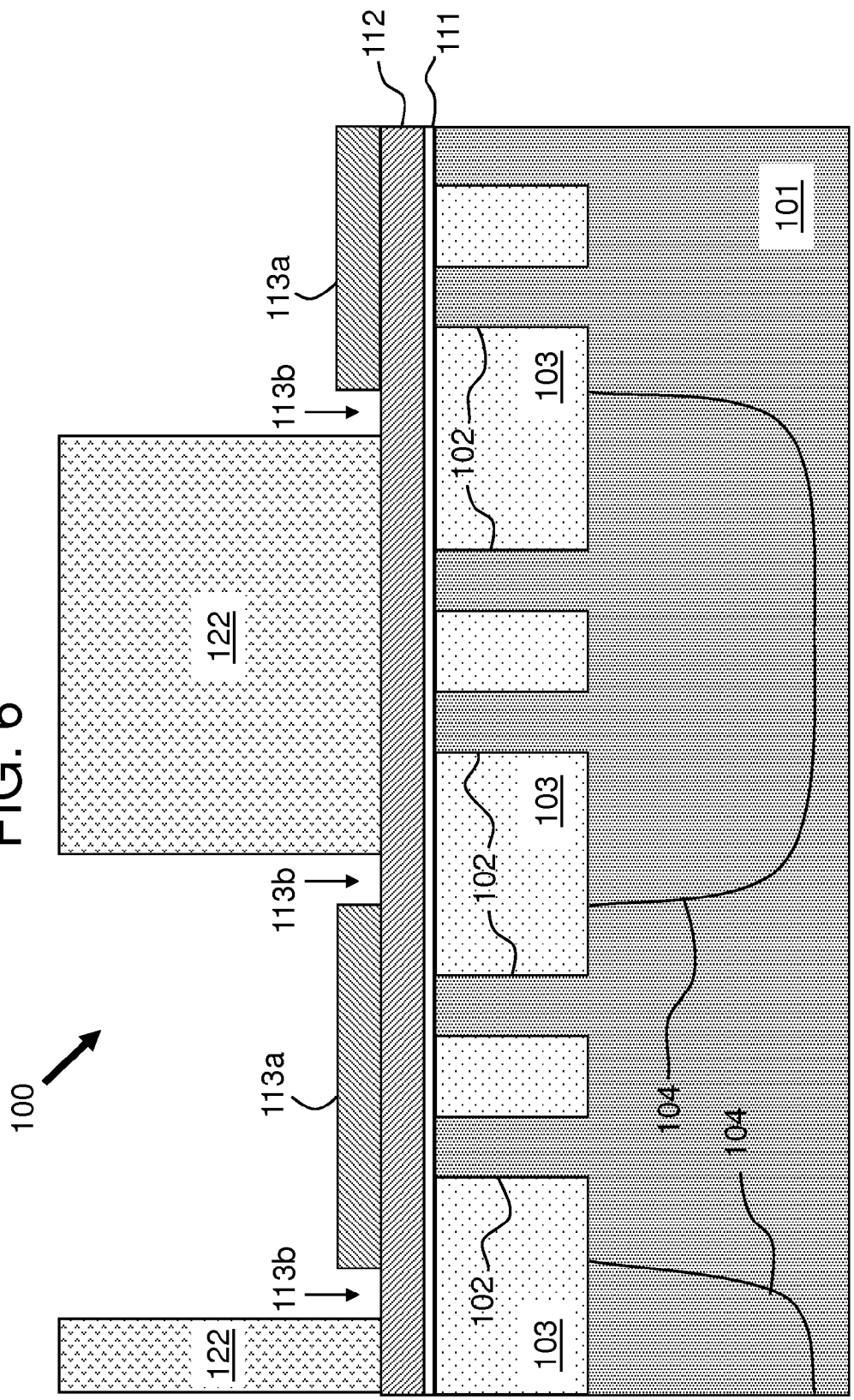
FIG. 6 is a demonstrative illustration of a step of a method of forming wells and isolation surrounding the wells, following the step illustrated in FIG. 5, according to one embodiment of present invention.

FIG. 6 is a demonstrative illustration of a step of a method of forming wells and isolations surrounding the wells, following the step illustrated in FIG. 5, according to one embodiment of present invention. More specifically, the method may include stripping off resist-mask 121 and subsequently forming a second resist-mask 122 that substantially covers, but not entirely, the exposed nitride layer 112. For example, the formed resist-mask 122 may have an offset, on its edges, from poly hard-mask 113a such that a gap 113b, in the order of 5~50 nm, is created that exposes portions of the underneath nitride hard-mask layer 112. The gap 113b may represent a width close to or slightly less than a width of well isolations to be formed between n-well (NW) and p-well (PW) later in substrate 101. This second resist-mask 122 may be formed through, for example, any well-known photolithographic patterning processes. According to one embodiment, in creating this second resist-mask 122, a mask pattern complementary to the one used in creating first resist-mask 121 may be used after the pattern size being properly scaled to leave the necessary gaps from poly hard-mask 113a.

Figure 7:
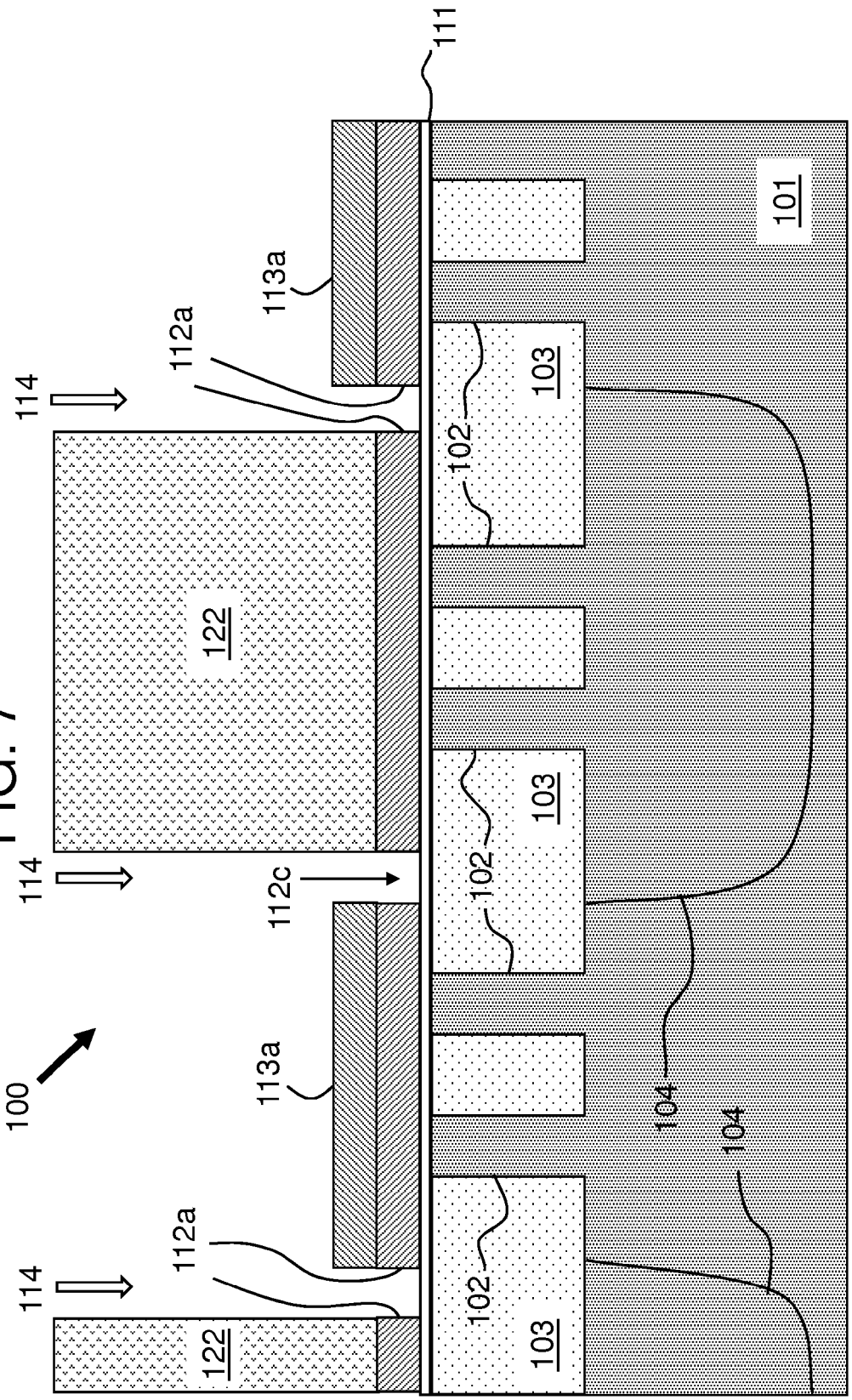
FIG. 7 is a demonstrative illustration of a step of a method of forming wells and isolation surrounding the wells, following the step illustrated in FIG. 6, according to one embodiment of present invention.

FIG. 7 is a demonstrative illustration of a step of a method of forming wells and isolations surrounding the wells, following the step illustrated in FIG. 6, according to one embodiment of present invention. For example, the method may include applying poly hard-mask 113a jointly with the second resist-mask 122 to pattern underneath nitride hard-mask layer 112 into a mask. More specifically, portions of nitride hard-mask layer 112 may be selectively removed through, for example, an etching technique 114 such as a reactive-ion-etching (RIE) process, wherein the portions being removed are neither covered by poly hard-mask 113a nor by the second resist-mask 122. In other words, portions of nitride hard-mask layer 112 that are exposed by the gaps 113b between poly hard-mask 113a and second resist-mask 122 are removed. As a result, the removal creates a nitride hard-mask 112a with openings 112c in areas corresponding to areas of substrate 101 between n-type wells and p-type wells. According to another embodiment, the creation of nitride hard-mask 112a may be performed at a later stage, such as after ion-implantation in forming p-type wells 105 which is described below in more details with reference to FIG. 8, but before the stripping off of the second resist-mask 122.

Figure 8:
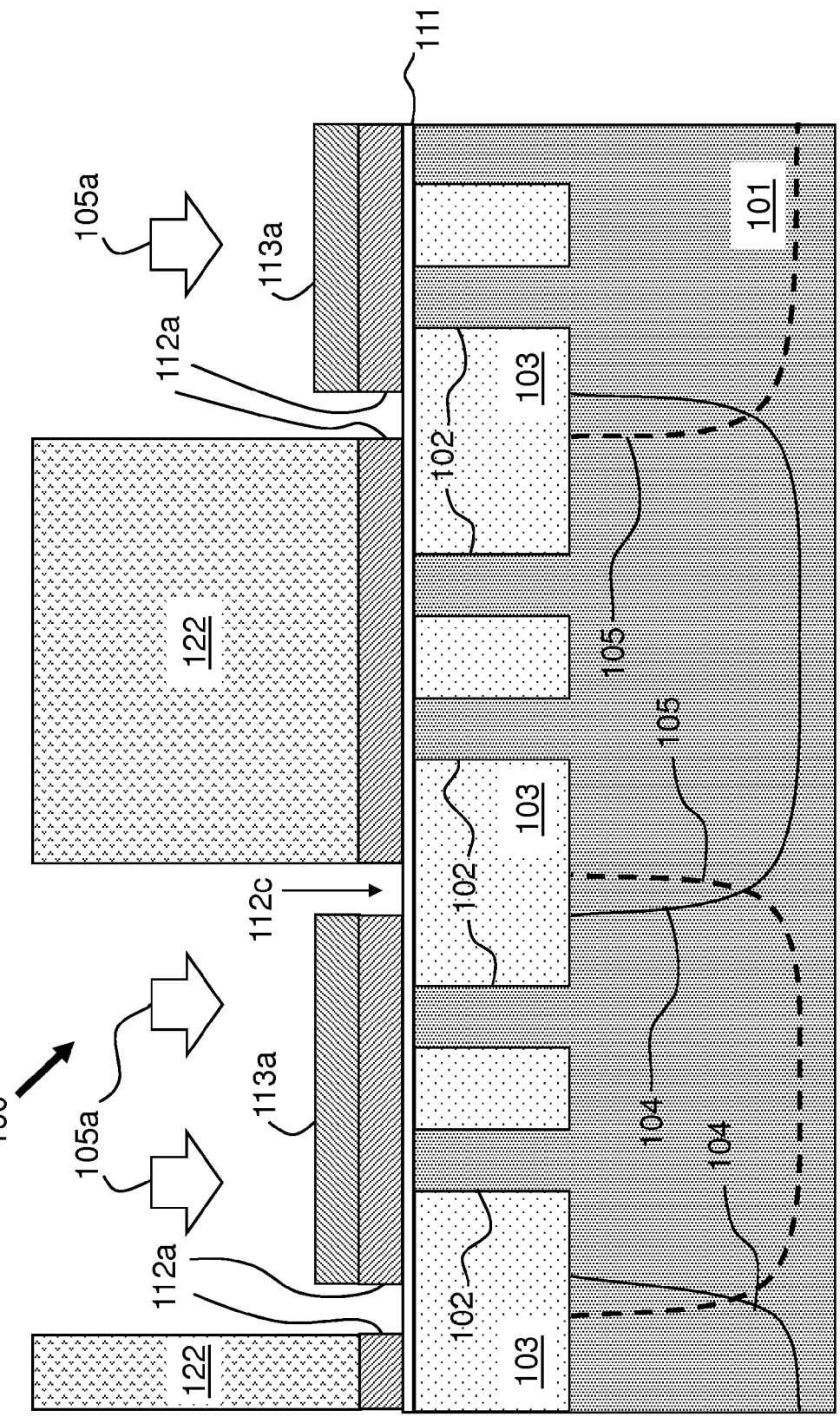
FIG. 8 is a demonstrative illustration of a step of a method of forming wells and isolation surrounding the wells, following the step illustrated in FIG. 7, according to one embodiment of present invention.

FIG. 8 is a demonstrative illustration of a step of a method of forming wells and isolations surrounding the wells, following the step illustrated in FIG. 7, according to one embodiment of present invention. As being discussed above, this step may be performed before the creation of nitride hard-mask 112a which employs both poly hard-mask 113a and resist-mask 122 in the creation process.

More specifically, ion implantation 105a may be performed at this stage to form positive or p-type wells in designated areas of substrate 101 using the second resist-mask 122 as an implantation mask. For example, positive ions such as, for example, boron (B+) or gallium (Ga+) may be implanted into areas of substrate 101 not covered by resist-mask 122 to form p-type wells 105. The implantation may cause the created p-type wells to have a certain level of overlap with existing n-type wells in areas of substrate 101 corresponding to areas of the gaps 113b between poly hard-mask 113a and resist-mask 122. Dosage and duration of implantation, as well as energy of ions may be controlled, as is known in the art, to achieve pre-determined depth and density of wells into substrate 101.

Figure 9:
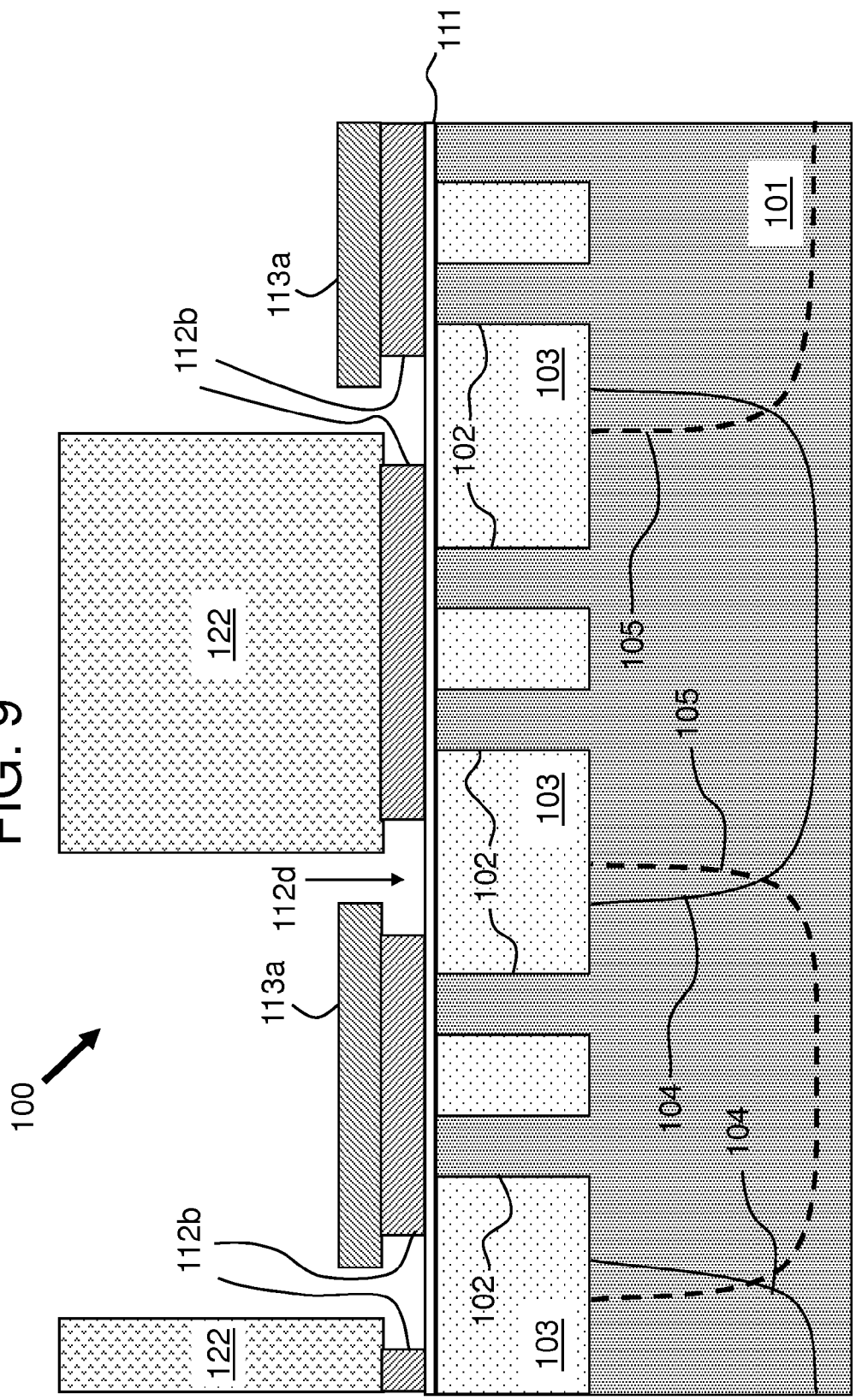
FIG. 9 is a demonstrative illustration of a step of a method of forming wells and isolation surrounding the wells, following the step illustrated in FIG. 8, according to one embodiment of present invention.

FIG. 9 is a demonstrative illustration of a step of a method of forming wells and isolations surrounding the wells, following the step illustrated in FIG. 8, according to one embodiment of present invention. After forming n-type wells (NW) and p-type wells (PW) in substrate 101, isolations such as trench isolations are subsequently formed to separate these two types of wells. According to one embodiment of present invention, the method may include directly applying nitride hard-mask 112a as a template in creating deep trenches inside substrate 101, which naturally self-aligns itself to the edge of the NW's and PW's. According to another embodiment, as being demonstratively illustrated in FIG. 9, the openings 112c in nitride hard-mask 112a may optionally be expanded laterally to some degree, such as around 2~20 nm depending on the fin pitch and other factors, in outward directions to become a modified nitride hard-mask 112b. Nitride hard-mask 112b may thus have openings 112d that are sufficiently wide to ensure coverage of substrate regions that are ion-implanted twice during both the NW formation and the PW formation. For example, the expansion of openings 112c in hard-mask 112a may be made through an isotropic etching of the nitride hard-mask 112a which may be selective to poly hard-mask 113a as well as resist-mask 122.

Figure 10:
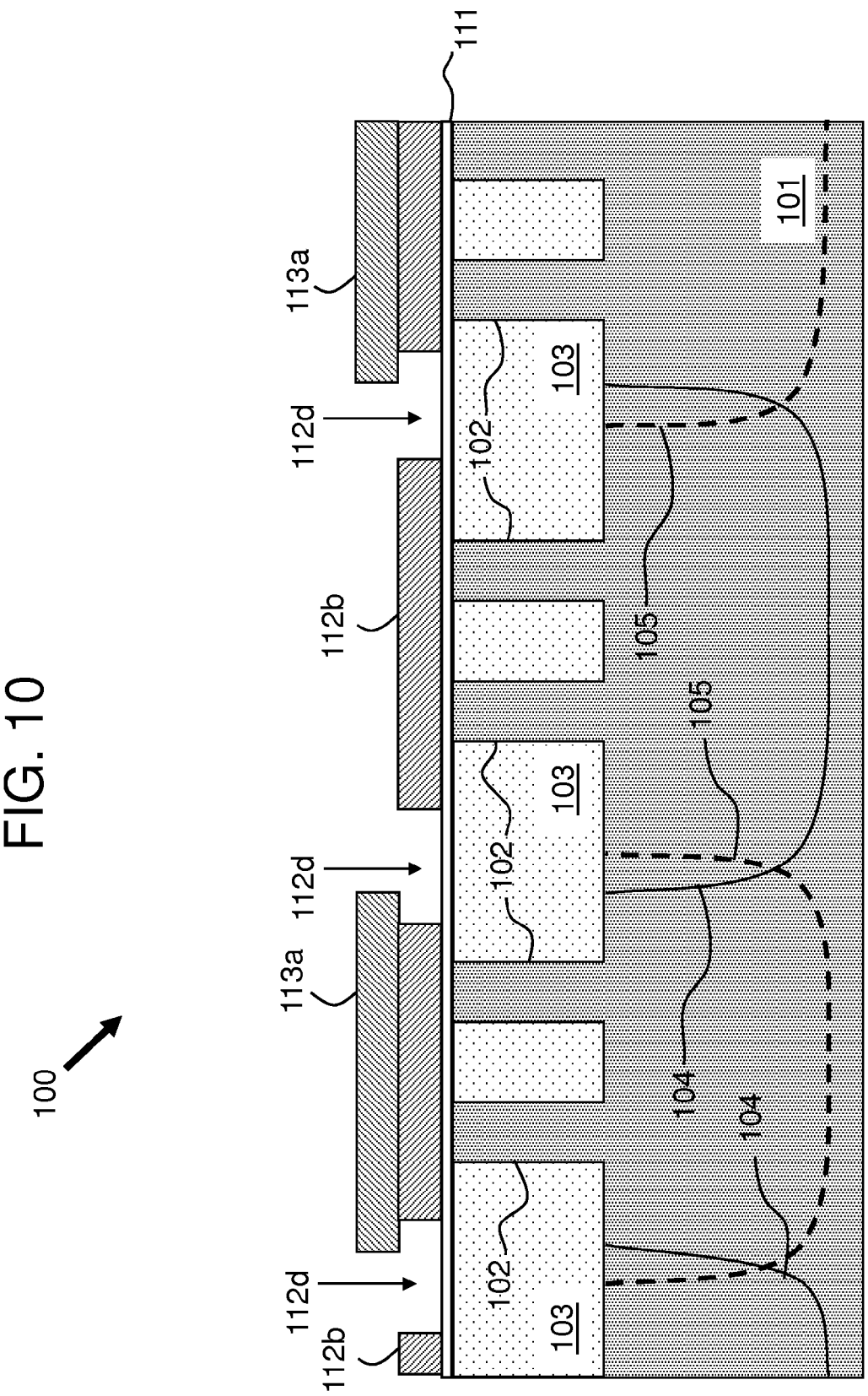
FIG. 10 is a demonstrative illustration of a step of a method of forming wells and isolation surrounding the wells, following the step illustrated in FIG. 9, according to one embodiment of present invention.

FIG. 10 is a demonstrative illustration of a step of a method of forming wells and isolations surrounding the wells, following the step illustrated in FIG. 9, according to one embodiment of present invention. More specifically, after modifying hard-mask 112a into hard-mask 112b with expanded or enlarged openings 112d, the method includes removing resist-mask 122 to expose underneath portions of hard-mask 112b. The removal of resist-mask 122 may be made through, for example, well known photo-resist stripping process, or by any other selective wet or dry etching processes.

Figure 11:
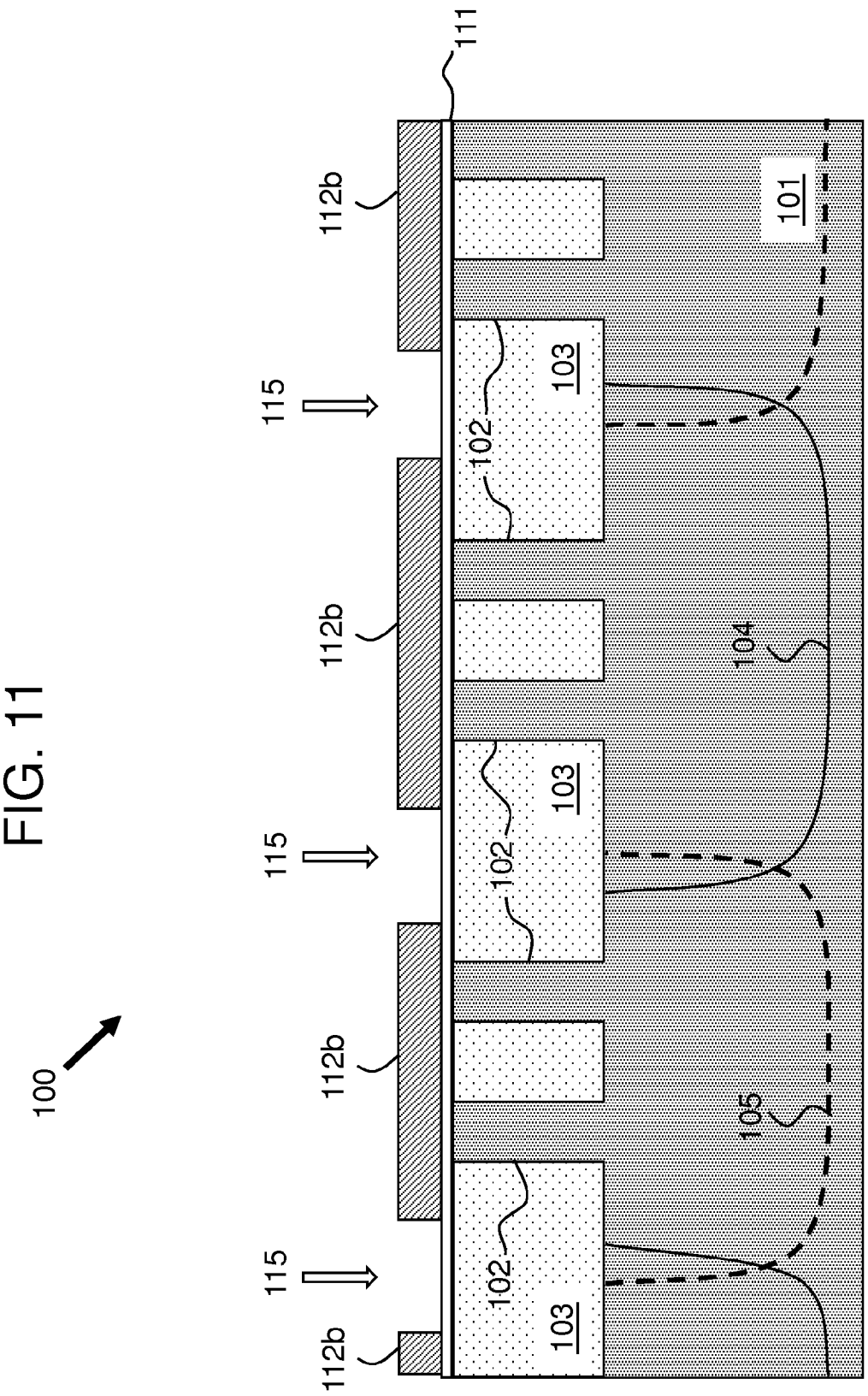
FIG. 11 is a demonstrative illustration of a step of a method of forming wells and isolation surrounding the wells, following the step illustrated in FIG. 10, according to one embodiment of present invention.

FIG. 11 is a demonstrative illustration of a step of a method of forming wells and isolations surrounding the wells, following the step illustrated in FIG. 10, according to one embodiment of present invention. Following the removal of resist-mask 122, poly hard-mask 113a may be removed as well, leaving only nitride hard-mask 112b covering underneath substrate 101 as well as fin structures 102 while regions that were double ion-implanted are exposed by the openings 112d in hard-mask 112b. The removal of poly hard-mask 113a may be optional and according to one embodiment may be removed during a subsequent process of creating deep trenches 115 inside substrate 101, such creation of deep trenches being described below in more details with reference to FIG. 12.

Figure 12:
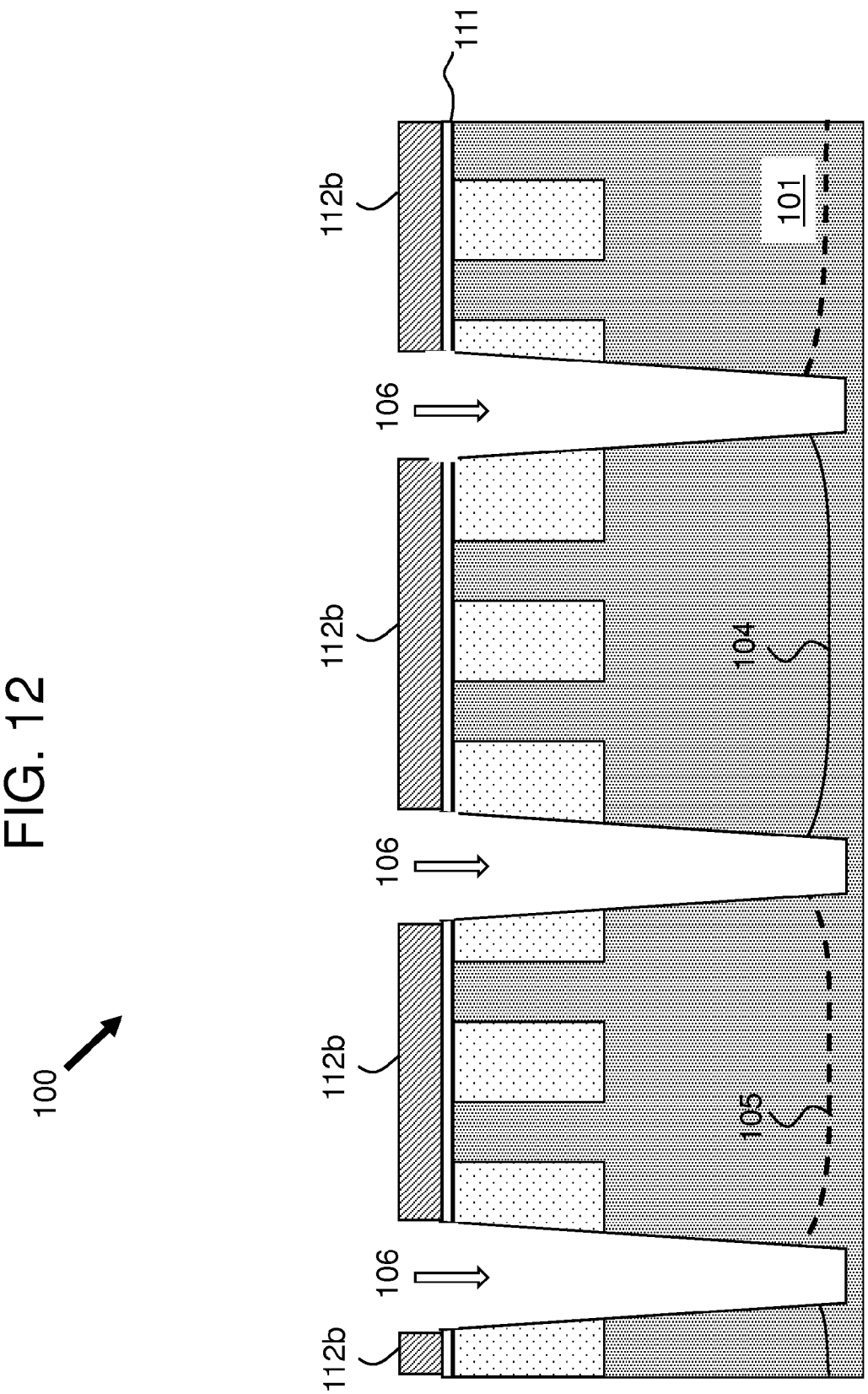
FIG. 12 is a demonstrative illustration of a step of a method of forming wells and isolation surrounding the wells, following the step illustrated in FIG. 11, according to one embodiment of present invention.

FIG. 12 is a demonstrative illustration of a step of a method of forming wells and isolations surrounding the wells, following the step illustrated in FIG. 11, according to one embodiment of present invention. More specifically, using nitride hard-mask 112b in protecting regions of substrate 101 underneath thereof, the exposed portions of substrate 101 may be selectively etched 115, through for example a RIE process, to create deep trenches 106 that would separate p-type wells 105 from n-type wells 104. The etching is generally directional, and may be performed sufficiently deep to cut through isolation structures 103, into and beyond the ion-implanted regions made in substrate 101 for both the p-type 105 and n-type wells 104. The resulting trenches 106 ensure that the two well regions are sufficiently separated from each other. Trenches 106 may preferably have straight sidewalls but in some embodiments may be in a trapezoidal shape due to the nature of etching.

Figure 13:
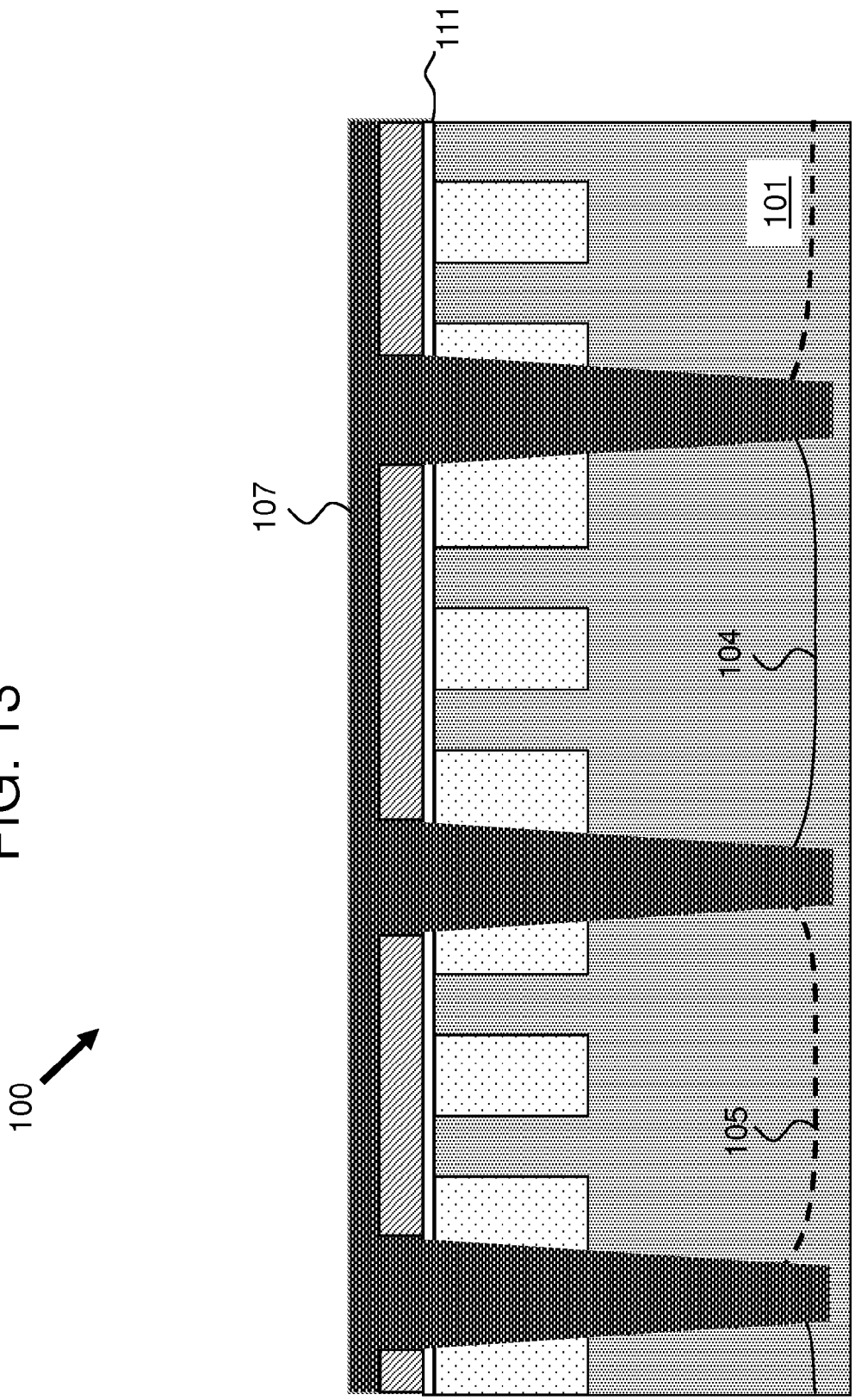
FIG. 13 is a demonstrative illustration of a step of a method of forming wells and isolation surrounding the wells, following the step illustrated in FIG. 12, according to one embodiment of present invention.

FIG. 13 is a demonstrative illustration of a step of a method of forming wells and isolations surrounding the wells, following the step illustrated in FIG. 12, according to one embodiment of present invention. Following the creation of deep trenches 106 in substrate 101, suitable insulating materials 107 such as oxide, nitride, and/or low-k dielectric materials may be deposited into deep trenches 106, although other suitable materials may be used as well to separate n-wells 104 from p-wells 105. In some instances, even air gaps may be used as insulating media and thus formed inside trenches 106 and the air gaps may function as an insulator. Any excess of insulating materials 107 that may be left on top of substrate 101 during the process of depositing into trenches 106 may be removed through, for example, a chemical-mechanic-polishing (CMP) process.

Figure 14:
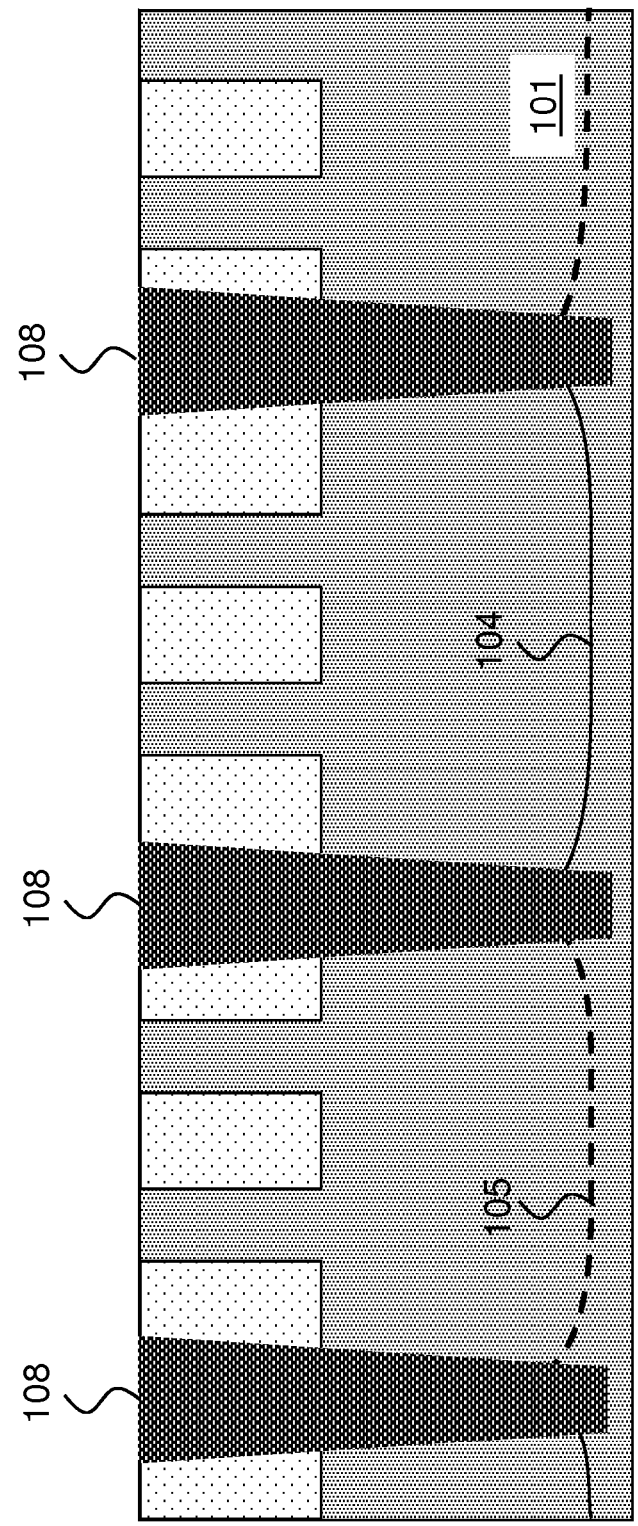
FIG. 14 is a demonstrative illustration of a step of a method of forming wells and isolation surrounding the wells, following the step illustrated in FIG. 13, according to one embodiment of present invention.

FIG. 14 is a demonstrative illustration of a step of a method of forming wells and isolations surrounding the wells, following the step illustrated in FIG. 13, according to one embodiment of present invention. More specifically, a CMP process is applied to remove excess insulating materials 107 on top of substrate 101. In together with the removal of material 107, nitride hard-mask 112b as well as underneath oxide layer 111 may be removed to expose underneath substrate 101, thereby creating well-isolation 108 and a top planar surface for further processing such as, for example, for forming fin-type transistors.

Figure 15:
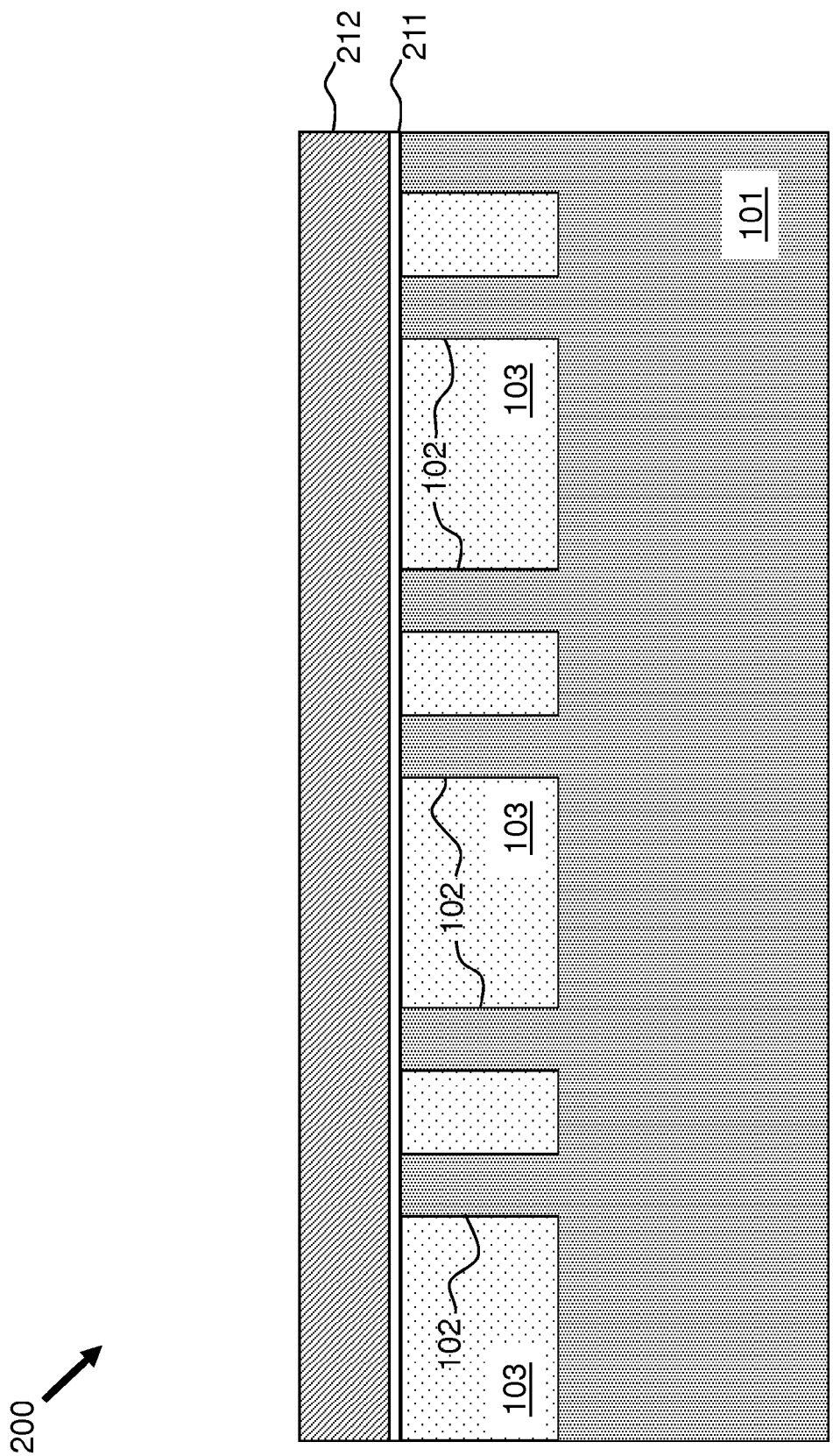
FIG. 15 is a demonstrative illustration of a step of a method of forming wells and isolation surrounding the wells according to another embodiment of present invention.

FIG. 15 is a demonstrative illustration of a step of a method of forming wells and isolations surrounding the wells according to another embodiment of present invention. More specifically, similar to the embodiment illustrated in FIG. 2, in order to form structure 200, embodiments of present invention may include forming an optional oxide layer 211 and subsequently a nitride hard-mask layer 212 on top of substrate 101 which has fin structures 102 and insulating structures 103 formed therein. However, different from the embodiment in FIG. 2, instead of forming a poly hard-mask 113 on top of nitride hard-mask 112, nitride hard-mask layer 212 may be formed to have a thickness around, for example, 55~65 nm that is thicker than, and sometimes twice as thick as, nitride hard-mask 112 illustrated in FIG. 2. Nitride hard-mask layer 212 is later formed into a nitride hard-mask 214 (FIG. 20), as being described below in more details, without the use of a poly hard-mask layer as in the previous embodiment illustrated in FIG. 2.

Figure 16:
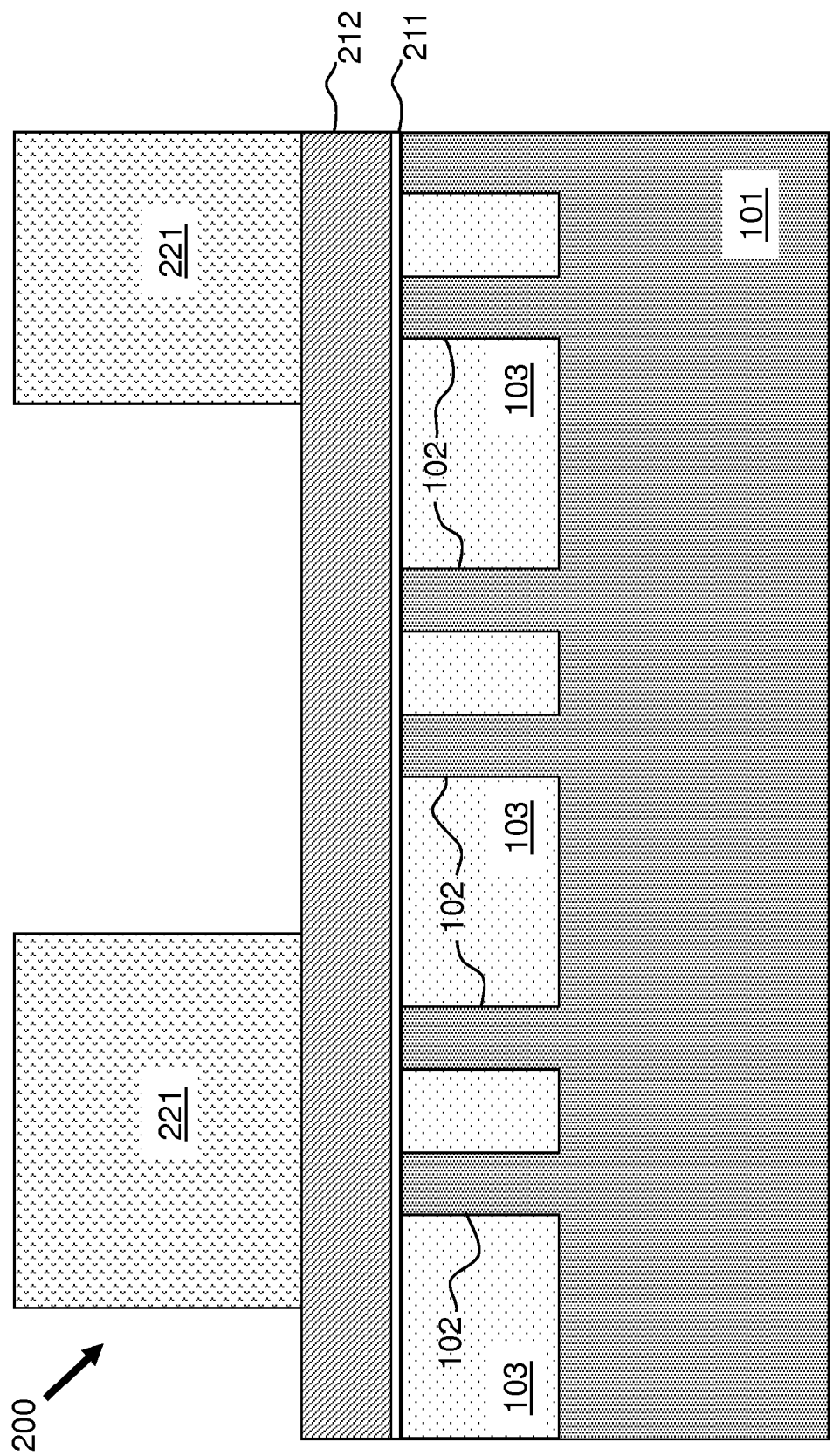
FIG. 16 is a demonstrative illustration of a step of a method of forming wells and isolation surrounding the wells, following the step illustrated in FIG. 15, according to one embodiment of present invention.

FIG. 16 is a demonstrative illustration of a step of a method of forming wells and isolations surrounding the wells, following the step illustrated in FIG. 15, according to one embodiment of present invention. More specifically, a photo-resist layer may be formed such as, for example, through a spin-on process on top of nitride hard-mask 212, and the photo-resist layer may subsequently be formed into a first resist-mask 221 through a photolithographic patterning process. Resist-mask 221 may represent a pattern wherein regions of substrate 101 to be formed into, for example, negative-type wells (NW) are exposed and regions to be formed later into positive-type wells (PW) are covered by resist-mask 221. In other words, resist-mask 221 may be used as an ion-implanting mask for forming, in the illustrated embodiment, NWs. As a person skilled in the art will appreciate, the order of forming NW and PW may be reversed and PW may be formed first using a similar process.

Moreover, resist-mask 221 may be used as a mask in partially etching underneath nitride hard-mask layer 212 in a process of transforming hard-mask layer 212 into a hard-mask 214. Nitride hard-mask layer 212 is made to preferably have a thickness that is at least twice a thickness that is suitable as a mask in a later deep trench etching process. For example, if a nitride hard-mask of 30 nm in thickness is needed for the later formation of deep trenches, nitride hard-mask layer 212 may be made to have a thickness of at least 60 nm. The depth of deep trenches may also dictate the required thickness of the hard-mask depending on a relative difference in etching ratio between substrate 101 and the hard-mask layer 212.

Figure 17:
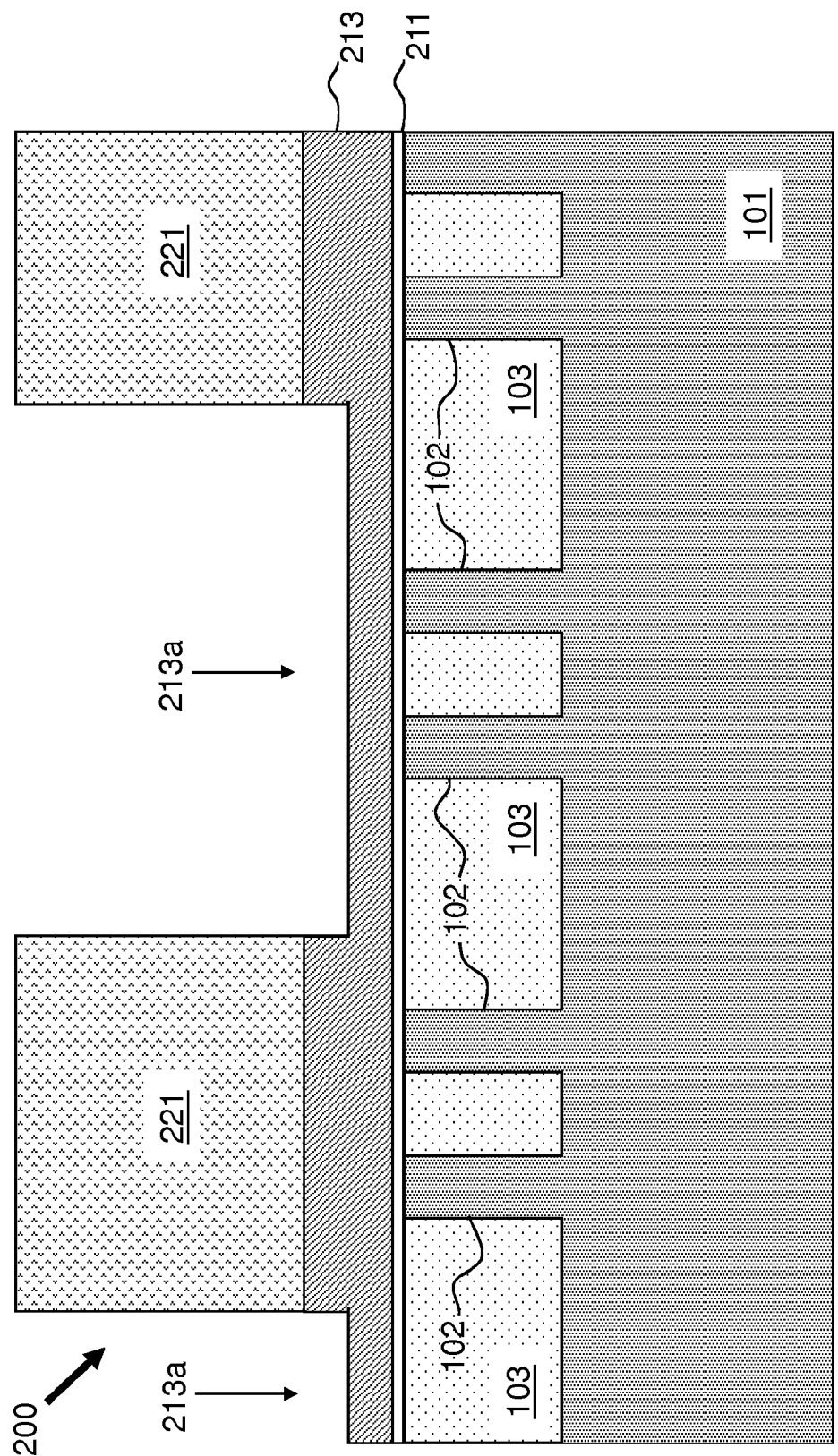
FIG. 17 is a demonstrative illustration of a step of a method of forming wells and isolation surrounding the wells, following the step illustrated in FIG. 16, according to one embodiment of present invention.

FIG. 17 is a demonstrative illustration of a step of a method of forming wells and isolations surrounding the wells, following the step illustrated in FIG. 16, according to one embodiment of present invention. More specifically, resist-mask 221 may be used in an etching process to remove partially nitride hard-mask layer 212 that are not covered, therefore exposed, by resist-mask 221. The removal may be made through, for example, a RIE process that is selective to photo-resist material. In other words, the RIE process may remove a top portion of the exposed nitride hard-mask layer 212 without substantially affecting resist-mask 221. According to one embodiment, the etching process may remove preferably about one half of the total thickness of nitride hard-mask layer 212. However, embodiment of present invention is not limited in this aspect, and the portion of removed nitride hard-mask layer 212 may vary ranging, for example, about 30 to 70 percentages of the total thickness of nitride hard-mask layer 212. In another embodiment, the amount of nitride hard-mask layer 212 being removed may depend upon the amount of thickness being left after the removal. For example, in one embodiment, the amount of thickness left may be made no less than 20 nm. The partial removal of nitride material from hard-mask layer 212 creates a modified nitride hard-mask layer 213 with recesses 213a therein. It is to be noted that this step of partially etching nitride hard-mask layer 212 may be performed after the next step, as being described below in more details with reference to FIG. 18, of ion-implantation.

Figure 18:
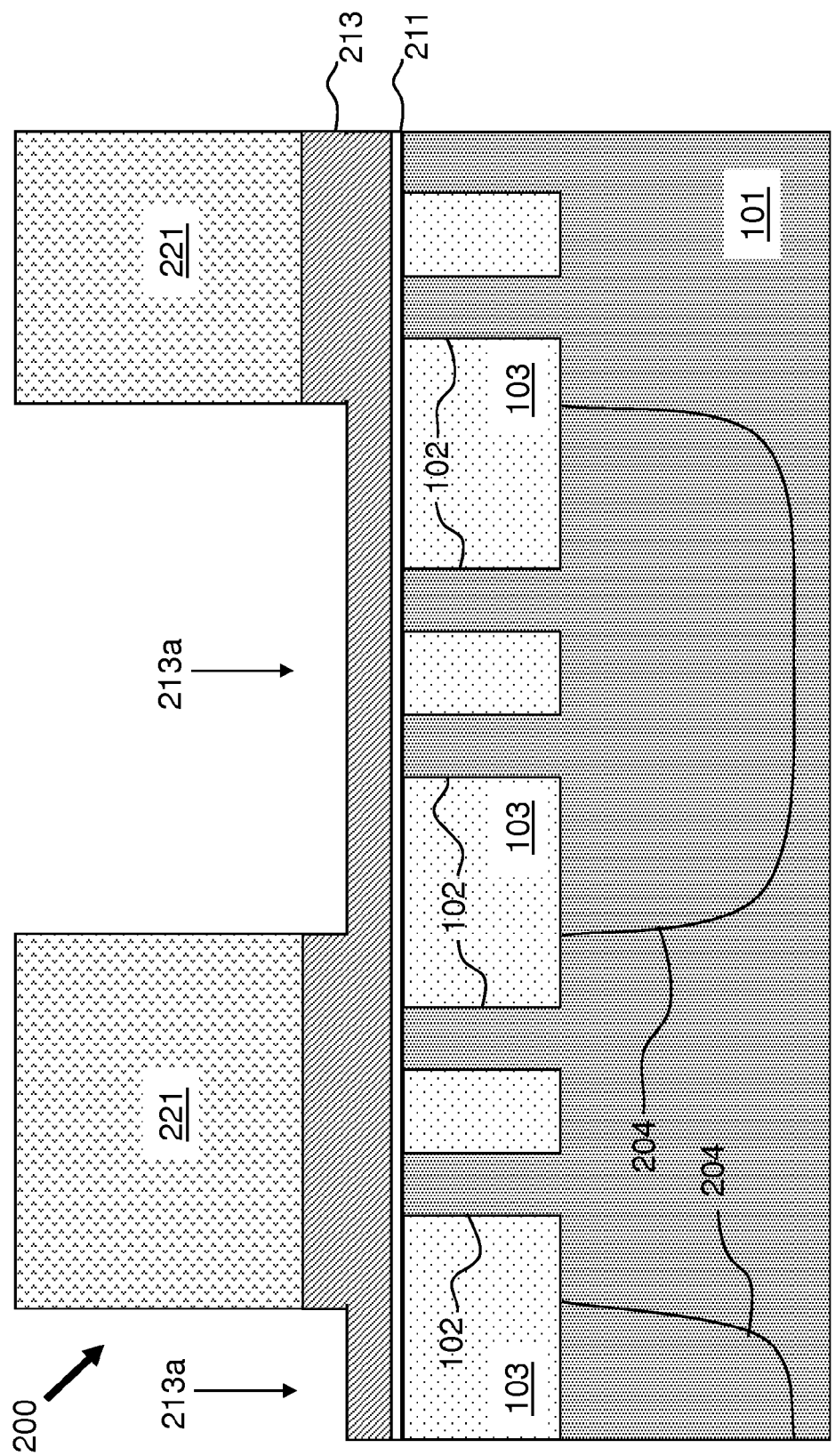
FIG. 18 is a demonstrative illustration of a step of a method of forming wells and isolation surrounding the wells, following the step illustrated in FIG. 17, according to one embodiment of present invention.

FIG. 18 is a demonstrative illustration of a step of a method of forming wells and isolations surrounding the wells, following the step illustrated in FIG. 17, according to one embodiment of present invention. More specifically, using resist-mask 221, ion-implantation may be performed to implant negative ions, such as $P^-$ and $As^-$, into substrate 101 to form regions of negative-wells 204. Optionally, this ion-implantation step may be performed before the step illustrated in FIG. 17, before thickness of the resist-mask 221 may be thinned during the etching of nitride hard-mask layer 212, even though such thinning is assumed to be small because of the selectivity of etchant used.

Figure 19:
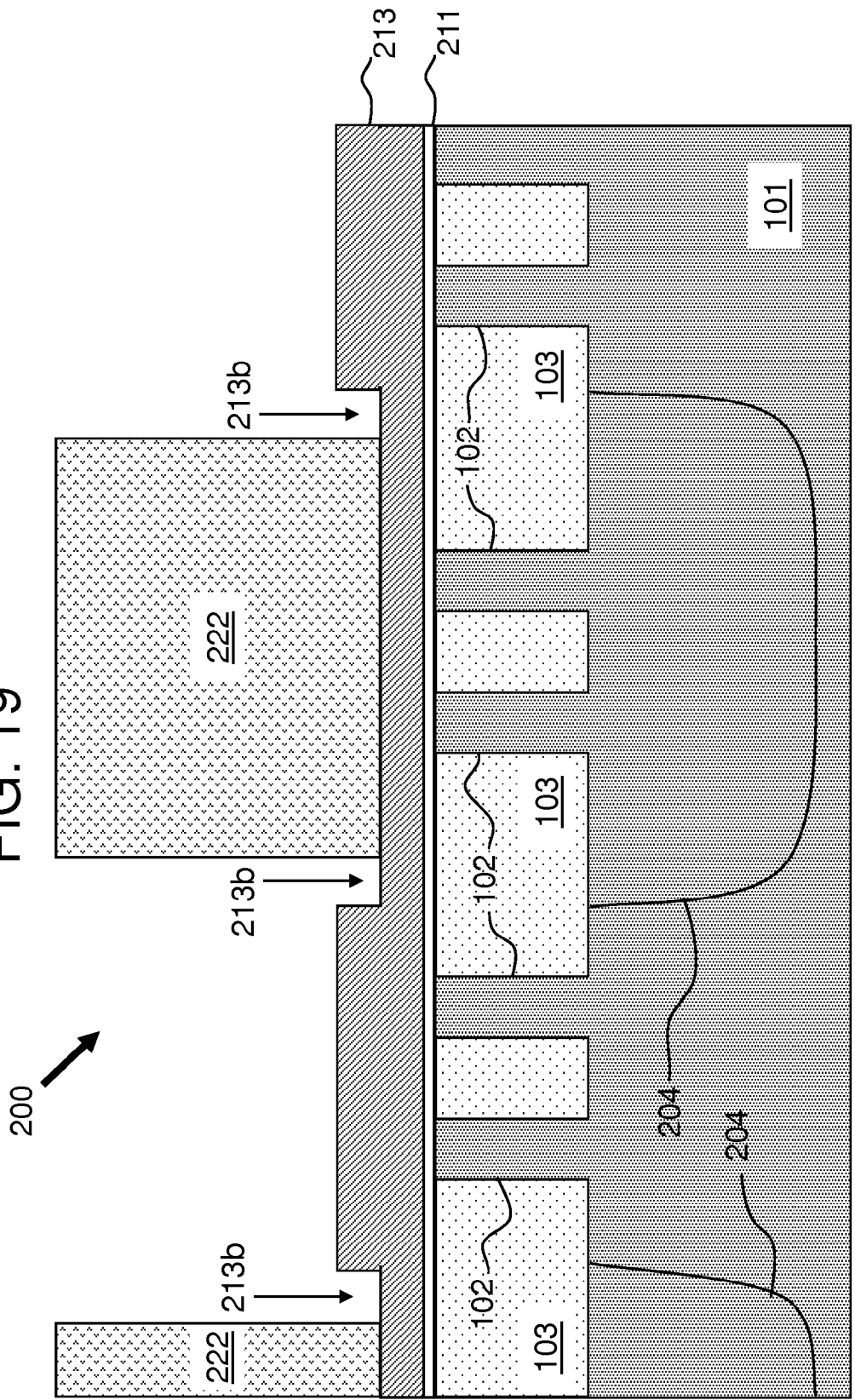
FIG. 19 is a demonstrative illustration of a step of a method of forming wells and isolation surrounding the wells, following the step illustrated in FIG. 18, according to one embodiment of present invention.

FIG. 19 is a demonstrative illustration of a step of a method of forming wells and isolation surrounding the wells, following the step illustrated in FIG. 18, according to one embodiment of present invention. More specifically, the method may include stripping off resist-mask 221 and subsequently forming a second resist-mask 222 in the recesses 213a formed inside nitride hard-mask layer 213. The second resist-mask 222 may substantially fill in, but not entirely, recesses 213a in the modified nitride hard-mask layer 213, creating gaps 213b between the edge of recesses 213a and the second resist-mask 222. The gaps 213b may represent a width of well isolations to be formed between n-well (NW) and p-well (PW) later in substrate 101. This second resist-mask 222 may be formed through, for example, any well-known photolithographic patterning processes. According to one embodiment, in creating this second resist-mask 222, a mask pattern complementary to the one used in creating first resist-mask 221 may be used after the pattern size being properly scaled to leave the necessary gaps 213b as being described above.

Figure 20:
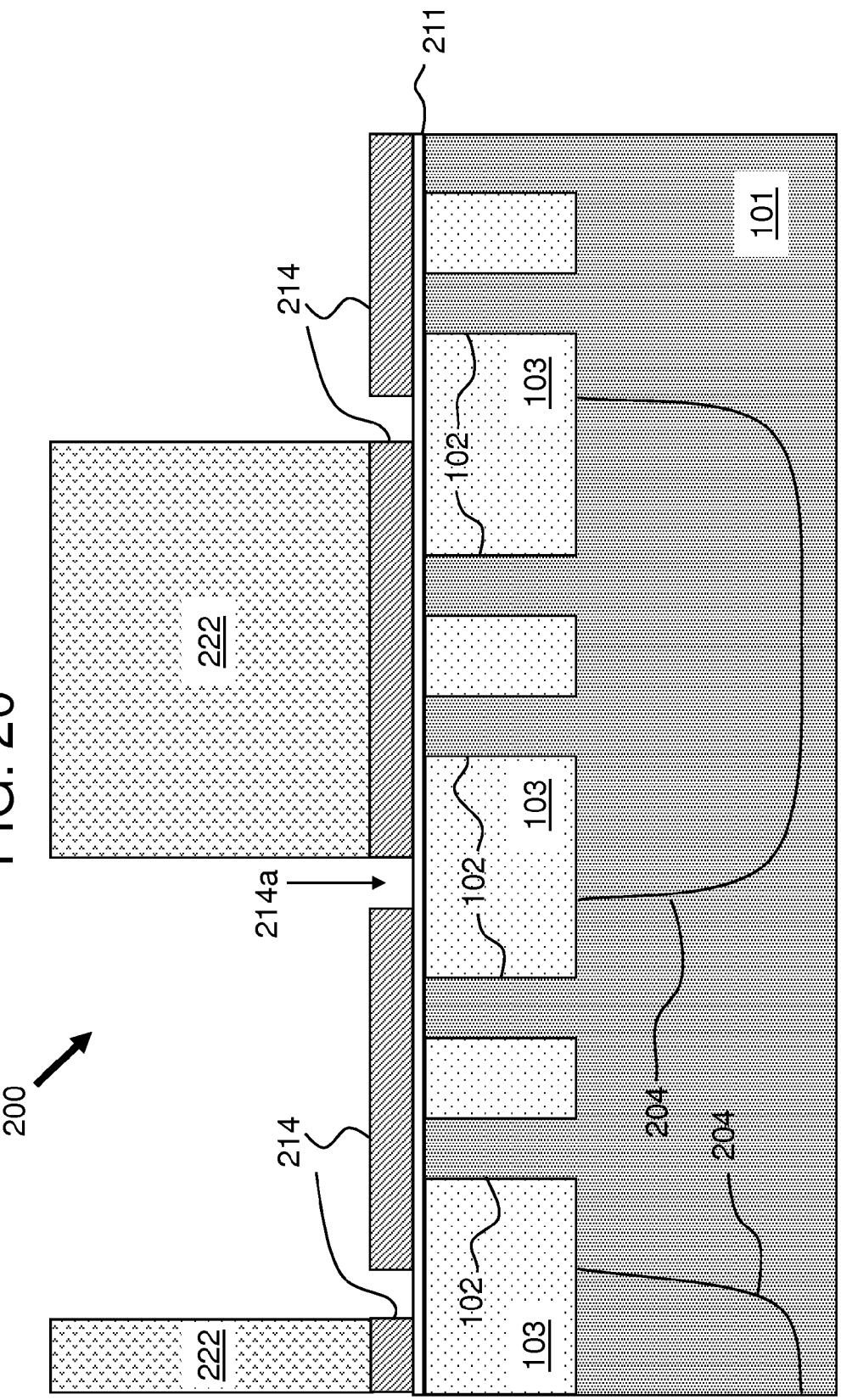
FIG. 20 is a demonstrative illustration of a step of a method of forming wells and isolation surrounding the wells, following the step illustrated in FIG. 19, according to one embodiment of present invention.

FIG. 20 is a demonstrative illustration of a step of a method of forming wells and isolation surrounding the wells, following the step illustrated in FIG. 19, according to one embodiment of present invention. More specifically, the method may include subjecting the exposed portion of the modified nitride hard-mask layer 213 to a directional selective etching process, such as a RIE process. The etching process may further deepen the gaps 213b between the edges of the recesses 213a and the second resist-mask 222 until underneath oxide layer 211, if any, or substrate 101 is exposed. The etching process may also lower the height of modified hard-mask layer 213 in areas that were previously covered by first resist-mask 221. As a result, a nitride hard-mask 214 is formed which has openings 214a that are self-aligned to underneath regions of substrate 101 to be formed into well-isolations later.

Figure 21:
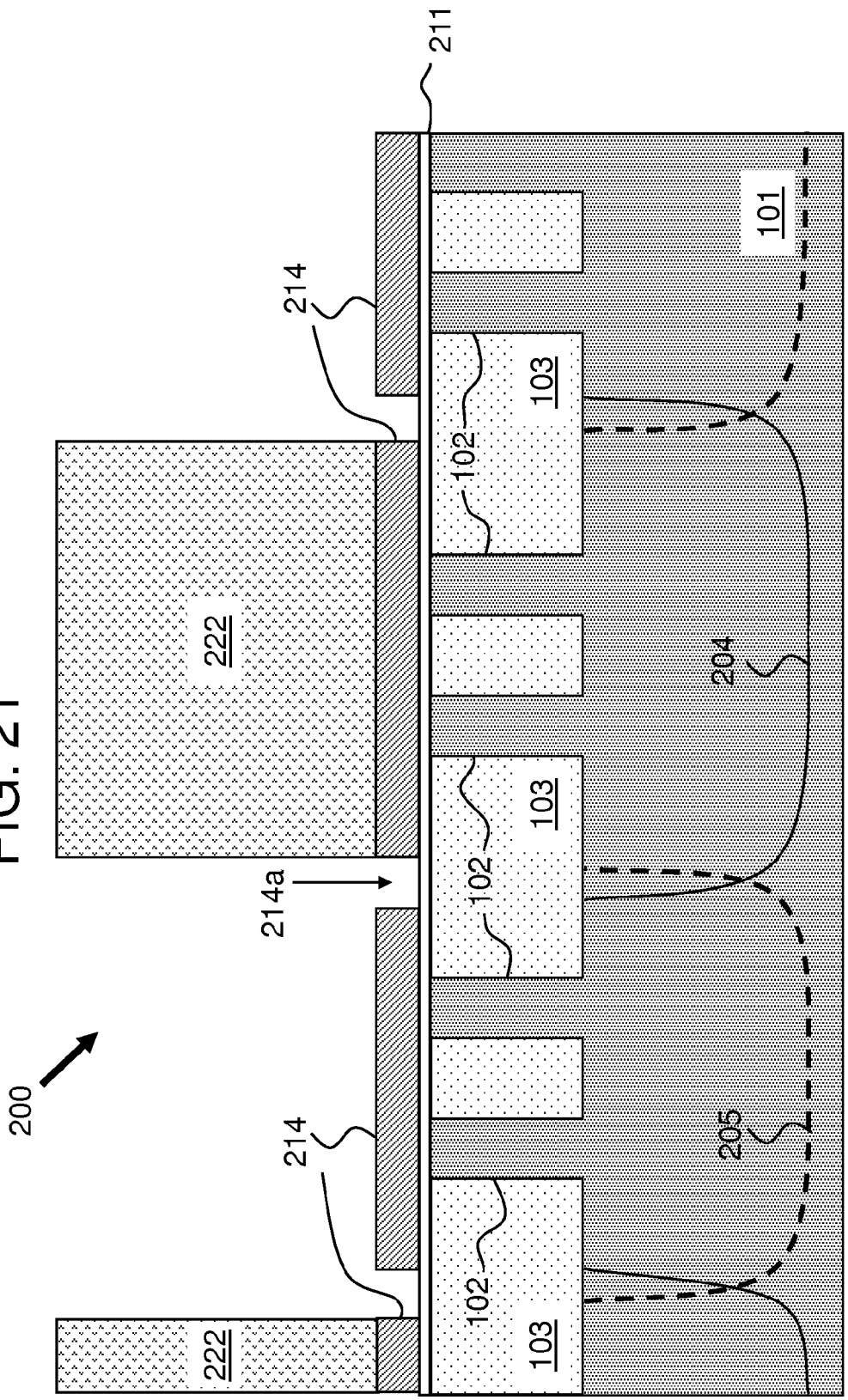
FIG. 21 is a demonstrative illustration of a step of a method of forming wells and isolation surrounding the wells, following the step illustrated in FIG. 20, according to one embodiment of present invention.

FIG. 21 is a demonstrative illustration of a step of a method of forming wells and isolation surrounding the wells, following the step illustrated in FIG. 20, according to one embodiment of present invention. For example, ion-implantation may be performed at this stage to form regions of substrate 101 that are not covered by second resist-mask 222 into, for example, positive-type wells (PW). In other words, embodiment of present invention applies resist-mask 222 as ion-implantation mask to implant positive ions, such as $B^+$ and $Ga^+$, into regions of substrate 101. The formed PWs may have an overlapping regions with the previously formed NWs in areas that are self-aligned to the openings 214a of nitride hard-mask 214. It is to be noted here that the step of ion-implantation illustrated herein may be performed before the step illustrated in FIG. 20 before the creation of nitride hard-mask 214.

Figure 22:
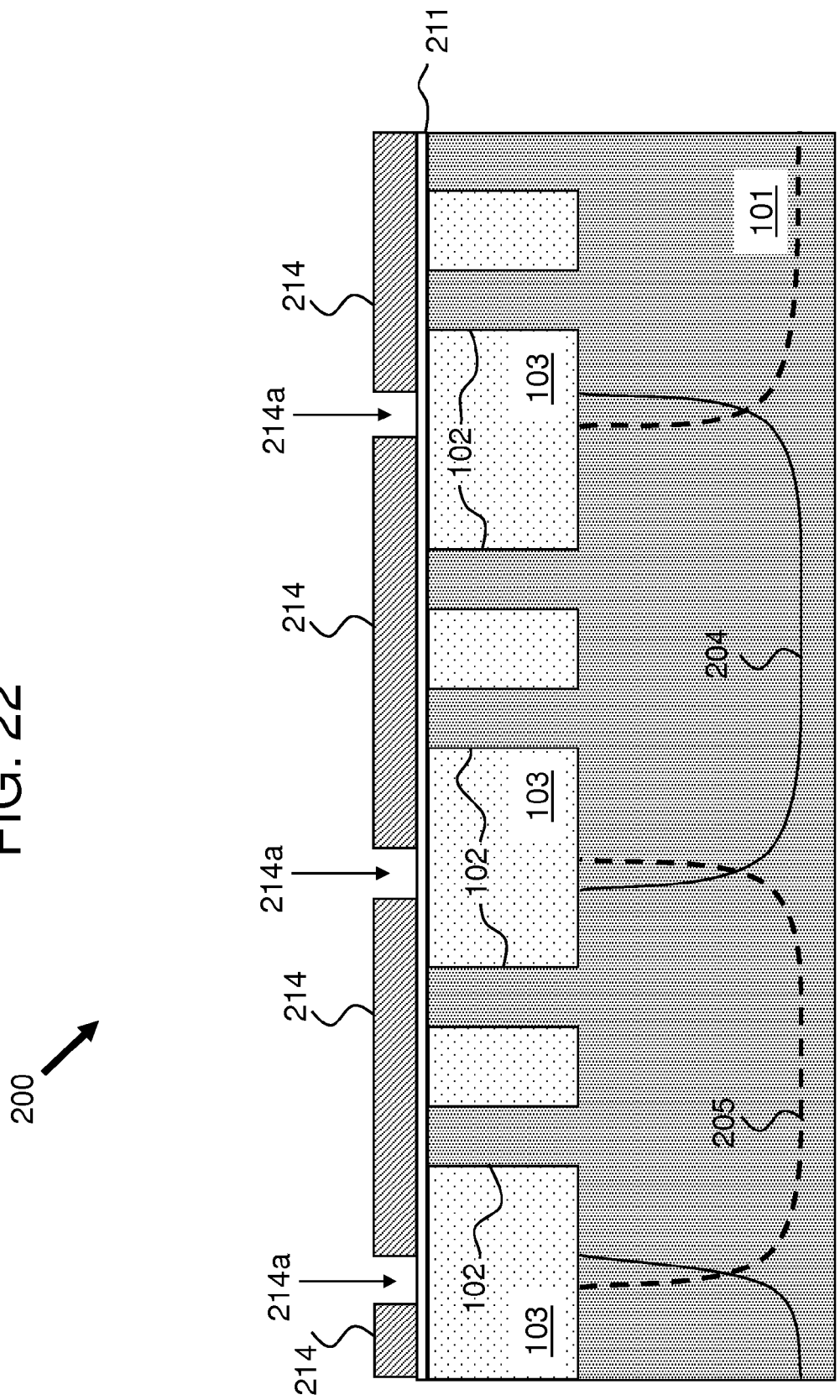
FIG. 22 is a demonstrative illustration of a step of a method of forming wells and isolation surrounding the wells, following the step illustrated in FIG. 21, according to one embodiment of present invention.

FIG. 22 is a demonstrative illustration of a step of a method of forming wells and isolation surrounding the wells, following the step illustrated in FIG. 21, according to one embodiment of present invention. Following the formation of both NWs and PWs in substrate 101, resist-mask 222 may be removed through, for example, a stripping process to expose underneath portions of hard-mask 214. The removal of resist-mask 222 may be optional at this stage if it does not affect the etching of substrate 101 in the next step in forming deep trenches that separate NWs and PWs in substrate 101.

Figure 23:
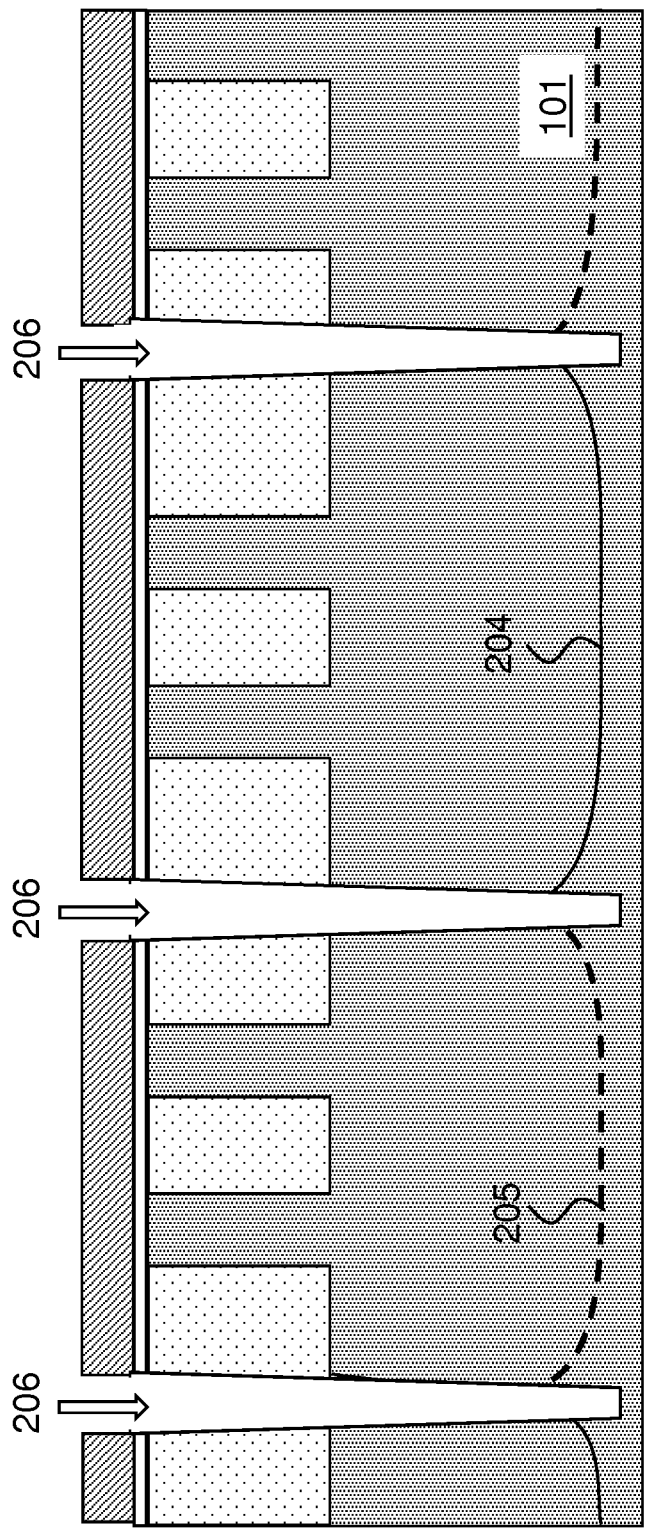
FIG. 23 is a demonstrative illustration of a step of a method of forming wells and isolation surrounding the wells, following the step illustrated in FIG. 22, according to one embodiment of present invention.

FIG. 23 is a demonstrative illustration of a step of a method of forming wells and isolation surrounding the wells, following the step illustrated in FIG. 22, according to one embodiment of present invention. More specifically, a selective etching process may be applied to etch and create deep trenches 206 inside substrate 101 which is self-aligned to the edges of NWs and PWs provided the openings 214a in the nitride hard-mask 214. Openings 214a are self-aligned to the edges of NWs and PWs because of the nature of their creation as being described above.

Figure 24:
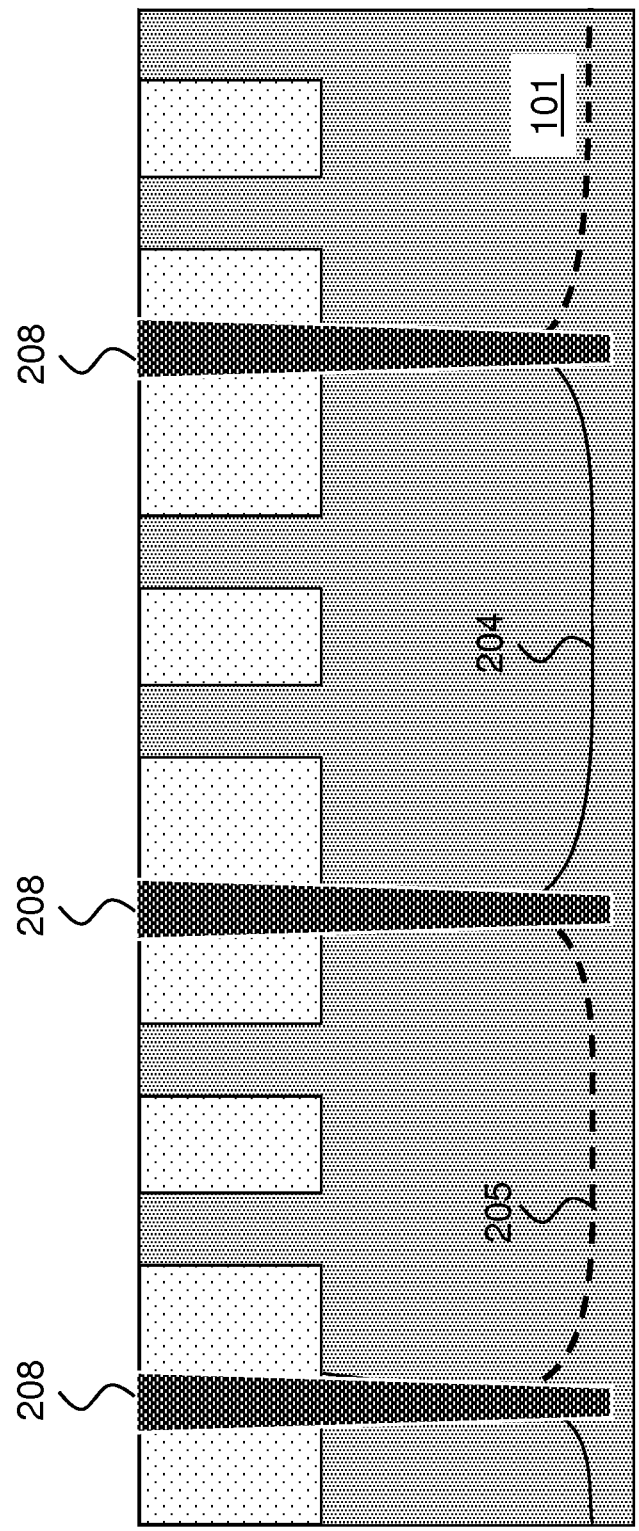
FIG. 24 is a demonstrative illustration of a step of a method of forming wells and isolation surrounding the wells, following the step illustrated in FIG. 23, according to one embodiment of present invention.

FIG. 24 is a demonstrative illustration of a step of a method of forming wells and isolation surrounding the wells, following the step illustrated in FIG. 23, according to one embodiment of present invention. Following the creation of deep trenches 206, insulating materials such as low-k dielectric, oxide, or nitride material may be used in filling in the trenches to form well-isolations 208. In some embodiments, air gaps may be built in as part of isolation media. Any excess of insulating materials, together with nitride hard-mask 214 and underneath oxide layer 211 may be removed through, for example, a CMP process.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
   forming a first hard mask layer on top of a semiconductor substrate;
   forming a second hard mask layer directly on top of the first hard mask layer;
   forming a first resist mask directly on top of the second hard mask layer and above a first region of the semiconductor substrate;
   removing a portion of the second hard mask layer selective to the first resist mask and the first hard mask layer;
   forming a first type well in a second region of the semiconductor substrate not covered by the first resist mask;
   forming a second resist mask directly on top of the first hard mask layer and above the second region of the semiconductor substrate, wherein a gap exists between a side of the second resist mask and a side of a remaining portion of the second hard mask layer;
   forming an opening in the first hard mask layer selective to the second resist mask and the remaining portion of the second hard mask layer;
   forming a second type well in the first region of the semiconductor substrate, the second type well at least partially overlapping the first type well in a third region of the semiconductor substrate, wherein the gap is directly above the third region of the semiconductor substrate;
   expanding the opening in the first hard mask layer horizontally using an isotropic etching process selective to the second hard mask layer and selective to the second resist mask;
   etching a deep trench in the third region of the semiconductor substrate, the deep trench separates the first type well from the second type of well; and
   filling the deep trench with insulating materials.

2. The method of claim 1, wherein etching the deep trench in the third region of the semiconductor substrate comprises:
   etching areas of the semiconductor substrate exposed by expanding the opening in the first hard mask layer.

3. The method of claim 1, wherein the first type well is implanted with negative ions and the second type well is implanted with positive ions.

4. The method of claim 1, wherein forming the opening in the first hard mask layer selective to the second resist mask and the remaining portion of the second hard mask layer comprises:
   selectively etching the first hard mask layer in areas that are neither covered by the remaining portion of the second hard mask layer nor covered by the second resist mask until an upper surface of the semiconductor substrate underneath the first hard mask layer is exposed.

5. The method of claim 1, wherein the first hard mask layer is materially different from the second hard mask layer and has different etch selectivity.

6. The method of claim 1, wherein forming first type well in the second region of the semiconductor substrate comprises:
   performing a first ion implantation in the second region of the semiconductor substrate that is not covered by the first resist mask.

7. The method of claim 1, wherein forming the second type well in the first region of the semiconductor substrate comprises:
   performing a second ion implantation in the first region of the semiconductor substrate that is not covered by the second resist mask.

8. A method comprising:
   forming a first hard mask layer on top of a semiconductor substrate;
   forming a second hard mask layer directly on top of the first hard mask layer;
   exposing a portion of the first hard mask layer by forming a first opening in the second hard mask layer above a first region of the semiconductor substrate;
   forming a first type well in the first region of the semiconductor substrate using an ion implantation technique;
   forming a second type well in a second region of the semiconductor substrate using an ion implantation technique, the second type well is adjacent to and partially overlaps the first type well; and
   forming a deep trench isolation structure between the first region and the second region of the semiconductor substrate, the deep trench isolation structure separates the first type well from the second type well, wherein forming the deep trench isolation structure between the first region and the second region of the semiconductor substrate comprises:
      forming a second opening in the exposed portion of the first hard mask layer directly above an area of the semiconductor substrate in which the first type well overlaps the second type well; and
      expanding the second opening horizontally using an isotropic etching process selective to at least the second hard mask layer.

9. The method of claim 8, wherein forming the deep trench isolation structure between the first region and the second region of the semiconductor substrate comprises:
   etching areas of the semiconductor substrate exposed by expanding the second opening of the first hard mask.

10. The method of claim 8, wherein the first hard mask layer is a nitride hard mask layer and the second hard mask layer is a poly-silicon hard mask layer.

11. The method of claim 8, wherein the first type well is implanted with negative ions and the second type well is implanted with positive ions.

12. The method of claim 8, wherein the first hard mask layer is materially different from the second hard mask layer and has a different etch selectivity.

13. A method comprising:
forming a first hard mask layer and a second hard mask layer on top of a semiconductor substrate;
forming a first resist mask above a first portion of the first hard mask layer and a corresponding portion of the second hard mask layer and forming a first type of wells in a first region of the semiconductor substrate that is not covered by the first resist mask;
forming a second resist mask above a second portion of the first hard mask layer and forming a second type of wells in a second region of the semiconductor substrate that is not covered by the second resist mask;
transforming the first hard mask layer into a first hard mask having openings aligned to areas overlapped by the first and second regions of the semiconductor substrate, wherein transforming the first hard mask layer into the first hard mask comprises:
applying the first resist mask in transforming the second hard mask layer into a second hard mask; and
applying the second hard mask and the second resist mask in transforming the first hard mask layer into the first hard mask,
wherein the second resist mask is formed directly on top of the first hard mask layer;
expanding the openings of the first hard mask horizontally in an isotropic etching process selective to the second hard mask and selective to the second resist mask;
etching at least the areas of the semiconductor substrate in creating deep trenches that separate the first and second types of wells; and
filling the deep trenches with insulating materials.

14. The method of claim 13, further comprising:
etching areas of the semiconductor substrate exposed by expanding the openings of the first hard mask in creating the deep trenches.

15. The method of claim 13, wherein the first type of wells are implanted with negative ions and the second type of wells are implanted with positive ions.

16. The method of claim 13, wherein applying the second hard mask and the second resist mask in forming the first hard mask comprises:
selectively etching the first hard mask layer in areas that are neither covered by the second hard mask nor covered by the second resist mask until the semiconductor substrate underneath the first hard mask layer is exposed.

17. The method of claim 13, wherein the first hard mask layer is materially different from the second hard mask layer and has different etch selectivity.

18. The method of claim 13, wherein forming the second resist mask on top of the second portion of the first hard mask layer comprises:
forming the second resist mask in a region not previously covered by the first resist mask, the second portion of the first hard mask layer being separated by a third portion of the first hard mask layer, from the first portion of the first hard mask layer.

19. The method of claim 18, wherein forming the first type of wells in the first region of the semiconductor substrate comprises:
performing a first ion implantation in the first region of the semiconductor substrate that is not covered by the first resist mask.

20. The method of claim 19, wherein forming the second type of wells in the second region of the semiconductor substrate comprises:
performing a second ion implantation in the second region of the semiconductor substrate that is not covered by the second resist mask, the second type of wells having overlapping regions with the first type of wells in areas corresponding to the third portion of the first hard mask layer.

* * * * *